United States Patent
Sato et al.

(10) Patent No.: US 8,599,944 B2
(45) Date of Patent: Dec. 3, 2013

(54) PULSE MODULATION CIRCUIT AND PULSE MODULATION METHOD

(75) Inventors: Junji Sato, Tokyo (JP); Shigeru Kobayashi, Tokyo (JP); Suguru Fujita, Tokyo (JP)

(73) Assignee: Panasonic Corporation, Osaka (JP)

( * ) Notice: Subject to any disclaimer, the term of this patent is extended or adjusted under 35 U.S.C. 154(b) by 1238 days.

(21) Appl. No.: 12/305,559

(22) PCT Filed: Jun. 19, 2007

(86) PCT No.: PCT/JP2007/062327
§ 371 (c)(1),
(2), (4) Date: Dec. 18, 2008

(87) PCT Pub. No.: WO2007/148691
PCT Pub. Date: Dec. 27, 2007

(65) Prior Publication Data
US 2009/0168919 A1    Jul. 2, 2009

(30) Foreign Application Priority Data

| Jun. 20, 2006 | (JP) | 2006-170450 |
| Jul. 13, 2006 | (JP) | 2006-193097 |
| Jun. 14, 2007 | (JP) | 2007-157937 |

(51) Int. Cl.
H04L 5/12     (2006.01)
H04B 1/00     (2006.01)
H04B 7/212    (2006.01)

(52) U.S. Cl.
USPC ............. 375/261; 375/147; 370/347

(58) Field of Classification Search
USPC ............. 375/261, 147; 370/347
See application file for complete search history.

(56) References Cited

U.S. PATENT DOCUMENTS 6,307,428 B1 * 10/2001 Nebel et al. .......... 329/311
6,340,932 B1 *  1/2002 Rodgers et al. ....... 340/572.7

(Continued)

FOREIGN PATENT DOCUMENTS

| JP | 61-59950   | 3/1986 |
| JP | 02-070524  | 5/1990 |

(Continued)

OTHER PUBLICATIONS

International Search Report dated Sep. 25, 2007 with English translation.

(Continued)

*Primary Examiner* — Leon-Viet Nguyen
*Assistant Examiner* — Sarah Hassan
(74) *Attorney, Agent, or Firm* — Dickinson Wright PLLC

(57) ABSTRACT

Provided is a pulse modulation circuit capable of generating a pulse modulation signal with a steep rise and a desired pulse width at a desired timing not depending on a transmission signal sequence. In this circuit, a control signal generation unit (110) generates a first control signal if transmission data (S11) is "1" and a second control signal if the transmission data (S11) is "0." The control signal generation unit (110) controls an oscillator (1200) of an intermittently operating circuit (120) to be at an oscillation state for outputting a desired first oscillation signal while the first control signal is turned ON and controls the oscillator (1200) to be at an idling state for outputting a second oscillation signal having a lower amplitude than the first oscillation signal while the second control signal is turned ON.

11 Claims, 15 Drawing Sheets

(56) References Cited

U.S. PATENT DOCUMENTS

| | | | |
|---|---|---|---|
| 6,434,192 B1* | 8/2002 | Aizawa et al. | 375/232 |
| 6,940,916 B1* | 9/2005 | Warner et al. | 375/261 |
| 7,110,435 B1* | 9/2006 | Sorrells et al. | 375/147 |
| 2001/0043093 A1 | 11/2001 | Sakura | |
| 2002/0142785 A1* | 10/2002 | Park et al. | 455/458 |
| 2002/0154620 A1* | 10/2002 | Azenkot et al. | 370/347 |
| 2004/0053595 A1* | 3/2004 | Shinbo et al. | 455/316 |
| 2005/0157522 A1* | 7/2005 | Osaka | 363/21.02 |
| 2009/0111394 A1* | 4/2009 | Vajha et al. | 455/90.2 |
| 2009/0256739 A1 | 10/2009 | Teshirogi | |

FOREIGN PATENT DOCUMENTS

| | | |
|---|---|---|
| JP | 11-74938 | 3/1999 |
| JP | 2001-326569 | 11/2001 |
| JP | 2001-326698 | 11/2001 |
| JP | 2004-112247 | 4/2004 |
| JP | 2004-153442 | 5/2004 |
| JP | 2005-49200 | 2/2005 |
| JP | 2005-217999 | 8/2005 |
| JP | 2005-346868 | 12/2005 |
| WO | 2006/041041 | 4/2006 |

OTHER PUBLICATIONS

T. Teshirogi, et al., "Residual-carrier-free burst oscillator for automotive UWB radar applications," Electronics Letters, Apr. 28, 2005, vol. 41 No. 9, pp. 1-2.

Microfilm of the specification and drawings annexed to the request of Japanese Utility Model Application No. 149808/1988(Laid-open No. 70524/1990) (Mitsubishi Electric Corp.), May 29, 1990.

* cited by examiner

PULSE MODULATION CIRCUIT AND PULSE MODULATION METHOD

TECHNICAL FIELD

The present invention relates to a pulse modulation circuit and pulse modulation method for generating alternating current signals intermittently according to transmission data.

BACKGROUND ART

Recently, an apparatus and system for carrying out communication and measuring the distance using pulse signals are under development, as one of techniques utilizing UWB (Ultra Wide Band). Methods of making a pulse signal an alternating current signal having only components of a desired frequency band, include intermittently carrying out oscillation by operating the oscillation circuit which is the alternating current signal source.

FIG. 1 shows a main configuration of a pulse modulation circuit that operates an oscillation circuit intermittently (see Patent Document 1). Pulse modulation circuit 10 shown in FIG. 1 is mainly divided into two parts of short pulse control generation circuit 11 that generates a pulse control signal and oscillation circuit 12 that carries out oscillation during the period of a short pulse. An input signal that determines the intermittent operation cycle is divided into two signals by distribution circuit 21 composed of resistances in short pulse control generation circuit 11, and one signal is inputted to the base terminal of transistor 23 as is and the other signal is delayed by a predetermined period in delay circuit 22 and then inputted to the emitter terminal of transistor 23.

By this means, a short pulse control signal that is shorter by a period matching the delay in delay circuit 22 than the input signal inputted to the base terminal of transistor 23, is generated. The short pulse control signal is inputted to oscillation circuit 12 and makes the oscillator composed of feedback circuit 32 and transistor 33 intermittently operate. Further, in FIGS. 1, 31 and 34 are amplifiers and 35 is the current source.

Further, Non-Patent Document 1 discloses a technique of making a pair of oscillation circuits perform a differential operation. FIG. 2 shows the configuration.

Patent Document 1: Japanese Patent Application Laid-Open No. 2005-49200
Non-Patent Document 1: "Residual-carrier-free burst oscillator for automotive UWB radar applications," ELECTRONICS LETTERS, Apr. 28, 2005, Vol. 41 No. 9

DISCLOSURE OF INVENTION

Problems to be Solved by the Invention

However, in the above circuit configuration, it takes time to start and stop the intermittent operation due to charging and discharging of a direct current blocking capacitor that applies the voltage individually to transistors and a stabilizing circuit that prevents unnecessary oscillation, and there is a problem that the differential operation is difficult in a short time. That is, depending on intervals in intermittent operation, that is, depending on intervals in which pulse signals are not outputted, the charged states of the direct current blocking capacitor and stabilizing circuit change, and as a result, the time to start oscillation or the time to stop oscillation changes due to a transmission data sequence and there is a problem that short pulse signals of a uniform pulse width and pulse positions cannot be outputted irrespectively of transmission data sequences.

For example, taking into account a pulse modulation apparatus that carries out OOK (On Off Keying) modulation to output an alternating current pulse when transmission data is "1" and not to output an alternating current pulse when transmission data is "0," when transmission data "1" is inputted and the alternating current pulse is outputted, the waveform of this alternating current pulse depends on the immediately preceding transmission sequence. That is, if "0's" continue as the immediately preceding transmission data sequence, the degrees of charge in the direct current blocking capacitor and stabilizing circuit decrease, and, as a result, the rise of the immediately following alternating current pulse becomes less steep and the rising timing is delayed.

If the pulse waveform changes due to the transmission data sequence in this way, it naturally follows that error rate characteristics upon reception deteriorate.

It is therefore an object of the present invention to provide a pulse modulation circuit and pulse modulation method that makes it possible to form a pulse modulation signal having a desired pulse waveform irrespectively of a transmission data signal sequence.

Means for Solving the Problem

To solve the above problem, the pulse modulation circuit according to the present invention employs a configuration including: an intermittent operation circuit that intermittently outputs a transmission signal according to a control signal; and a control circuit that, according to transmission data, controls switching of the intermittent operation circuit between a transmission mode in which a first transmission signal is outputted and an idling mode in which a second transmission signal of a lower amplitude or lower frequency than the first transmission signal is outputted.

According to this configuration, the idling mode is provided in addition to the transmission mode, so that the parasitic capacity of the intermittent operation circuit in the transmission mode is charged virtually uniform in the idling mode even if the immediately preceding mode is not the transmission mode. By this means, it is possible to make the pulse waveform of the first transmission signal irrespective of the immediately preceding transmission data sequence. That is, it is possible to generate the first transmission signal that has a desired pulse width and that is generated steeply at a desired timing, irrespectively of a transmission data sequence, so that the receiving end is able to reduce deterioration of reception capability due to variation of a spectrum and a timing jitter and acquire optimal received quality. In addition, in the idling mode, the intermittent operation circuit is operated to generate a second transmission signal of a low amplitude or low frequency, so that it is possible to generate a pulse modulation signal having a desired pulse waveform while suppressing power consumption as much as possible.

Advantageous Effect of The Invention

The present invention is able to form a pulse modulation signal having a desired pulse waveform irrespectively of a transmission data signal sequence.

BEST MODE FOR CARRYING OUT THE INVENTION

Embodiments of the present invention will be described in detail below with reference to the drawings. Further, a case will be described below as an example where OOK (On Off Keying) modulation is carried out to output an alternating current pulse when transmission data is "1" and not to output an alternating current pulse when transmission data is "0."

(Embodiment 1)

Figure 3:
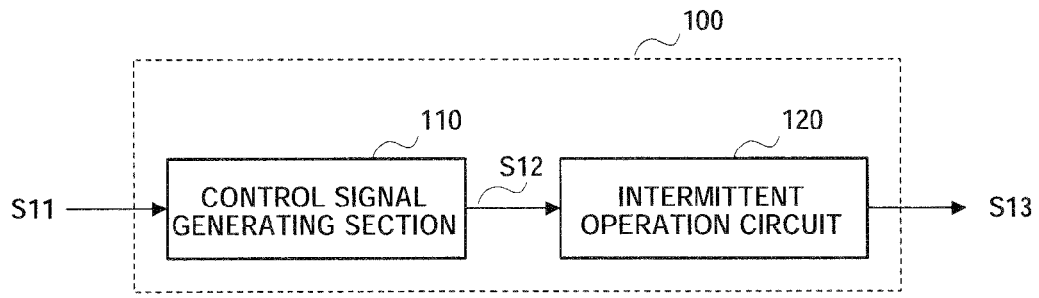
FIG. 3 is a block diagram showing the main configuration of a pulse modulation circuit according to Embodiment 1 of the present invention.

FIG. 3 shows the main configuration of the pulse modulation circuit according to Embodiment 1 of the present invention. Pulse modulation circuit 100 shown in FIG. 3 has control signal generating section 110 and intermittent operation circuit 120.

Figure 4:
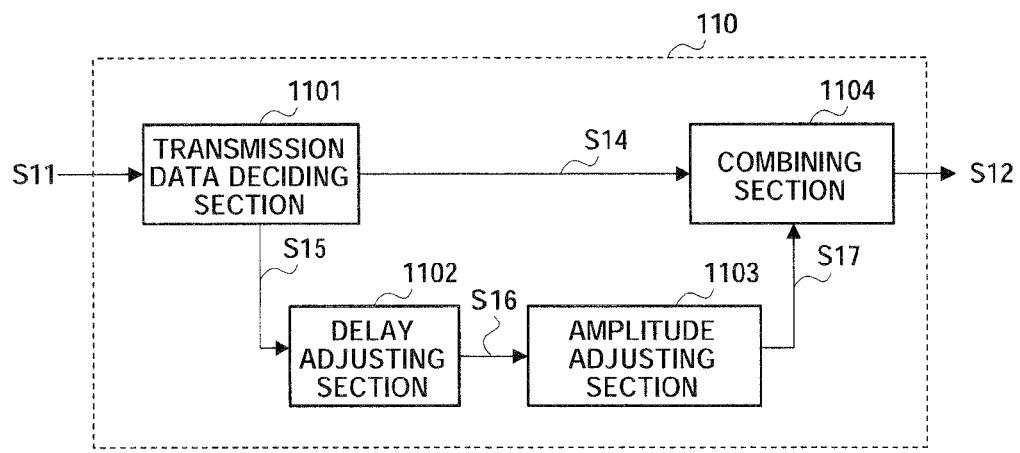
FIG. 4 is a block diagram showing the main configuration of a control signal generating section according to Embodiment 1.

FIG. 4 shows the main configuration of control signal generating section 110. Control signal generating section 110 shown in FIG. 4 has transmission data deciding section 1101, delay adjusting section 1102, amplitude adjusting section 1103 and combining section 1104, and generates control signal S12 according to transmission data S11 and outputs control signal S12 to intermittent operation circuit 120. Each section of control signal generating section 110 will be described below using the timing chart of signal waveforms of FIG. 5.

Figure 5:
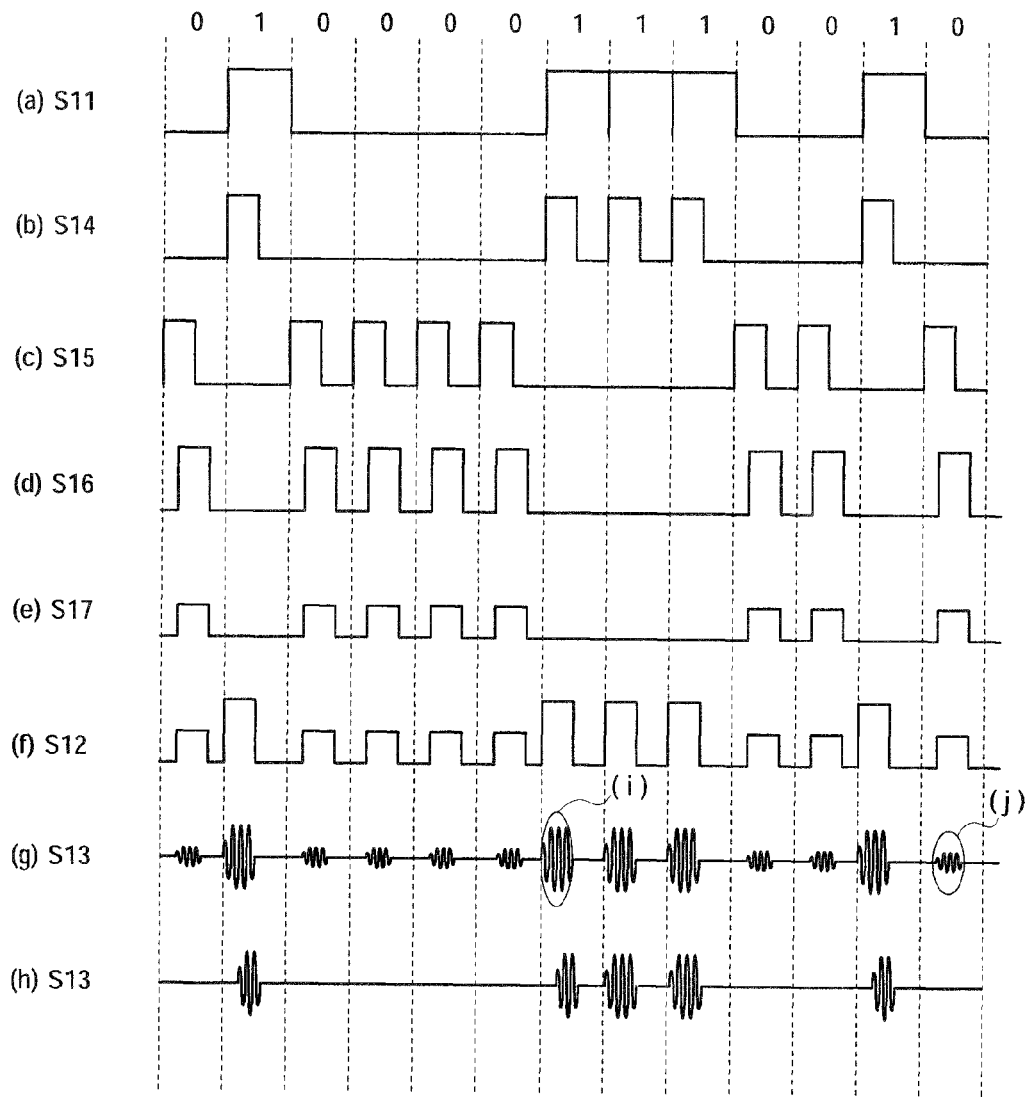
FIG. 5 shows signal waveforms of a control signal and transmission signal according to Embodiment 1.

Transmission data deciding section 1101 decides whether transmission data S11 (FIG. 5(a)) is "1" or "0," generates first control signal S14 (FIG. 5(b)) that rises at a timing matching the start timing of the transmission pulse signal outputted when transmission data S11 is "1" and that has a pulse width equal to the pulse width of the transmission pulse signal, and outputs first control signal S14 to combining section 1104. On the other hand, transmission data deciding section 1101 generates control signal S15 (FIG. 5 (c)) that rises at a timing matching the start timing of the transmission pulse signal outputted when transmission data S11 is "1" and that has a pulse width equal to the pulse width of the transmission signal, and outputs control signal S15 to delay adjusting section 1102.

Using the logical circuit of one input and two outputs in transmission data deciding section 1101, first control signal S14 and control signal S15 may be generated by inverting one output according to transmission data S11.

Further, if pulse position modulation (PPM) is adopted to change a position of a timing a transmission pulse signal occurs, according to transmission data, transmission data deciding section 1101 only needs to generate first control signal S14 and control signal S15 according to whether or not there is a transmission pulse signal in the pulse period.

Delay adjusting section 1102 delays the start timing of control signal S15 outputted from transmission data deciding section 1101 by a predetermined period and outputs delayed control signal S16 (FIG. 5(d)) to amplitude adjusting section 1103. Further, the delay time of control signal S16 will be described later.

Amplitude adjusting section 1103 decreases the amplitude of control signal S16 outputted from delay adjusting section 1102, and outputs control signal S17 (FIG. 5(e)) with an adjusted amplitude, to combining section 1104 as a second control signal. That is, when transmission data S11 is "0," second control signal S17 having a lower amplitude level than the amplitude level of first control signal S14 generated when transmission data S11 is "1," is generated. Further, the amplitude level of control signal S17 will be described later.

Combining section 1104 combines first control signal S14 and second control signal S17 and outputs combined control signal S12 (FIG. 5(f)) to intermittent operation circuit 120.

Figure 6:
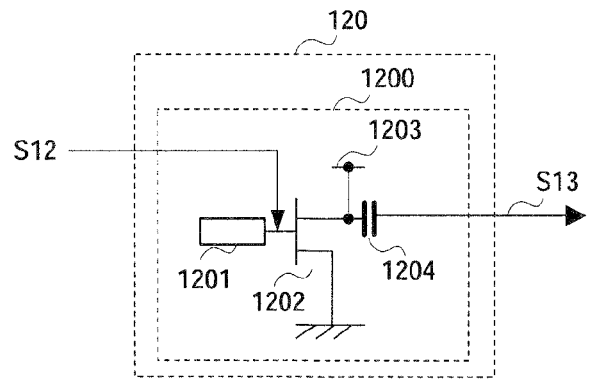
FIG. 6 is a block diagram showing a main configuration of an intermittent operation according to Embodiment 1.

FIG. 6 shows the main configuration of intermittent operation circuit 120. Intermittent operation circuit 120 shown in FIG. 6 has oscillator 1200 that has resonator 1201, transistor 1202, bias terminal 1203 and DC (Direct Current) cut capacitor 1204, operates intermittently according to control signal S12, and generates pulse signal S13. Referring back to the timing chart of signal waveforms of FIG. 5, each section of intermittent operation circuit 120 will be described below.

The output end of resonator 1201 is connected to the gate terminal end of transistor 1202 and one terminal of bias terminal 1203 and DC cut capacitor 1204 are connected to the drain terminal end of transistor 1202.

Control signal S12 outputted from control signal generating section 110 is outputted to the gate terminal of transistor 1202. By this means, during the ON voltage value of control signal S12, the voltage is applied to the gate terminal and, accompanying this, the current flows between the source and drain. Then, the current flowing between the source and drain triggers the charging of the parasitic capacity of transistor 1202. Then, the circuit current starts flowing accompanying the source-drain current and this circuit current amplifies an oscillation signal, so that the amplified oscillation signal is outputted as pulse signal S13 (FIG. 5(g)).

That is, when transmission data S11 is "1," the first oscillation signal (FIG. 5(i)) is outputted from oscillator 1200 by means of the first control signal (hereinafter "oscillation mode"), and, when transmission data S11 is "0," a second oscillation signal (FIG. 5(j)) is outputted from oscillator 1200 by means of a second control signal (hereinafter "idling mode"), and these first oscillation signal and second oscillation signal are outputted as pulse signal S13.

In this way, even when transmission data S11 is "0," by means of control signal S12 obtained by combining the first control signal and second control signal, a voltage is applied to the gate terminal and the parasitic capacity of transistor 1202 is charged. That is, in an interval in which a transmission pulse signal is not originally outputted, the parasitic capacity of transistor 1202 is pre-charged in the idling mode, so that it is possible to make steep a rise of the first oscillation signal generated immediately after the mode continues in which the first oscillation signal is not generated (FIG. 5(i)).

By contrast with this, apart from the present embodiment, in a case where the parasitic capacity of transistor 1202 is pre-charged by operating transistor 1202 to the oscillation mode during ON first control signal S14 generated when transmission data S11 is "1," the degree of charge of the parasitic capacity of transistor 1202 varies depending on whether or not immediately preceding transistor 1202 has been in the oscillation mode, that is, whether transmission data S11 is "0" or "1," variation of the start timing and pulse width of pulse signal S13' is produced (FIG. 5(h)).

However, as in the present embodiment, even when transmission data S11 is "0," the parasitic capacity is charged by applying a voltage to the gate terminal of transistor 1202 by means of a second control signal and operating transistor 1202 in an idling mode, so that it is possible to charge uniform the parasitic capacity of transistor 1202 irrespectively of transmission data s11, and, consequently, generate the first oscillation signal having a steep rise irrespectively of transmission data S11 (FIG. 5(i)).

Next, referring back to the timing chart of signal waveforms shown in FIG. 5, the operation of pulse modulation circuit 100 configured as described above will be described.

Transmission data S11 is outputted to transmission data deciding section 1101 of control signal generating section 110. A case will be described where a data sequence "0100001110010" is subjected to OOK modulation as transmission data S11.

When transmission data S11 is "1," transmission data deciding section 1101 generates first control signal S14 (FIG. 5(b)) that rises at a timing matching the start timing of the transmission pulse signal to be outputted and that has a pulse width equal to the pulse width of the transmission signal and outputs first control signal S14 to combining section 1104. On the other hand, when transmission data S11 is "0," transmission data deciding section 1101 generates control signal S15 (FIG. 5(c)) that rises at a timing matching the start timing of the transmission pulse signal outputted when transmission data S11 is "1" and that has a pulse width equal to the pulse width of the transmission signal and outputs control signal S15 to delay adjusting section 1104.

Control signal S15 is further delayed by a predetermined period by delay adjusting section 1102 and delayed control signal S16 (FIG. 5(d)) is outputted to amplitude adjusting section 1103. Further, the amplitude level of control signal S16 is adjusted by amplitude adjusting section 1103 and the control signal with an adjusted level is outputted to combining section 1104 as second control signal S17 (FIG. 5(e)).

Then, first control signal S14 and second control signal S17 are combined by combining section 1104 and combined control signal S12 (FIG. 5(f)) is outputted to the gate terminal of transistor 1202 of intermittent operation circuit 120. By this means, a voltage is applied to the gate terminal of transistor 1202 during ON control signal S12, the source-drain current starts flowing and the parasitic capacity of transistor 1202 is charged. Then, the circuit current starts flowing accompanying the source-drain current, this circuit current amplifies an oscillation signal and the amplified oscillation signal is outputted as pulse signal S13 (FIG. 5(g)).

That is, transistor 1202 enters the oscillation mode by means of first control signal S14 and outputs the first oscillation signal (FIG. 5(i)), and transistor 1202 enters the idling mode by means of second control signal S17 and outputs a second oscillation signal (FIG. 5(j)), and these first oscillation signal and second oscillation signal are outputted as pulse signal S13 (FIG. 5(g)) from oscillator 1200.

Next, the delay time and amplitude level of second control signal S17 will be described.

As described above, even when transmission data S11 is "0," second control signal S17 is generated by control signal generating section 110, a voltage is applied to the gate terminal of transistor 1202 during ON second control signal S17 and transistor 1202 enters the idling mode.

By so doing, even when transmission data S11 is "0" and a transmission pulse signal is not originally generated, the parasitic capacity of transistor 1202 is charged during ON control signal S17.

Then, during OFF control signal S17, the charged parasitic capacity of transistor 1202 starts being discharged. The timing the parasitic capacity starts being charged and the timing the charged parasitic capacity starts being discharged are determined by timings control signal S17 is ON or OFF, that is, by the delay time adjusted by delay adjusting section 1102.

Further, although a case has been described where control signal S15 is delayed in delay adjusting section 1102 and as a result the start timing for control signal S17 is adjusted, the start timing of control signal S17 needs not to be delayed necessarily. However, during OFF control signal S17, the parasitic capacity of transistor 1202 starts discharging, so that, if the start timing of control signal S17 comes earlier, the timing to start being discharged comes earlier. Consequently, it is necessary to charge the parasitic capacity of transistor 1202 sufficiently in advance by increasing the amplitude level of control signal S17 before ON control signal S17.

On the other hand, in a case where control signal S15 is delayed in delay adjusting section 1102, the start timing of control signal S17 is delayed and consequently the timings transistor 1202 starts being charged and discharged are delayed, so that it is possible to charge transistor 1202 to the same degree as in a case where control signal S17 is not delayed, even if the amplitude level of control signal S17 is low, and realize lower power consumption.

For example, in a case where control signal S17 is delayed more than a one-fourth of the symbol section, even if the amplitude level of control signal S17 is adjusted to a lower level by amplitude adjusting section 1103, it is confirmed according to simulation that the parasitic capacity of transistor 1202 can be charged sufficiently.

Further, the parasitic capacity of transistor 1202 after discharging only needs to be charged by the amount to the extent that the first oscillation signal rises steeply at the start timing of the transmission pulse signal to be outputted. The required degree of charge depends on characteristics of transistor 1202. Further, the degree of charge of transistor 1202 after discharging depends on the timing transistor 1202 starts being charged, that is, the timing transistor 1202 is switched to the idling mode. The degree of charge of transistor 1202 after discharging further depends on the amplitude level applied to the gate terminal of transistor 1202. Consequently, by calculating the required degree of charge from the characteristics of transistor 1202, the timing transistor 1202 is switched to the idling mode, that is, the delay time in delay adjusting section 1102 and the degree of amplitude adjustment in amplitude adjusting section 1103, may be set based on the required degree of charge.

Further, although a case has been described with the above description where, by adjusting the delay time and voltage, control signal S17 is generated when transmission data S11 is "0" and the pulse width of control signal S17 is not adjusted, the pulse width may further be adjusted in delay adjusting section 1102 such that the pulse width of control signal S17 becomes narrow. When the pulse width of control signal S17 becomes narrow, the period the intermittent operation circuit operates in the idling mode when transmission data S11 is "0" becomes shorter than the period the intermittent circuit operates in the oscillation mode when transmission data S11 is "1," so that it is possible to reduce the power consumption. The pulse width can be adjusted by using, for example, an AND logical circuit.

Further, in a case where the mode is switched to a stop mode in which the voltage is not applied to the gate terminal of transistor 1202 and none of the first and second oscillation signals are outputted, between the oscillation mode or the idling mode, it is possible to make distinct the rise of the first oscillation signal outputted in the oscillation mode and acquire the start timing of the pulse signal at the receiving end in a reliable manner.

Further, with the present embodiment, even when transmission data S11 is "0," given that a voltage is applied to the gate terminal by means of second control signal S17, although a second oscillation signal which is originally unnecessary as the transmission pulse signal is generated as shown in FIG. 5(*j*), this second oscillation signal can be removed by providing, for example, a switch in a subsequent stage to intermittent operation circuit 120.

Figure 7:
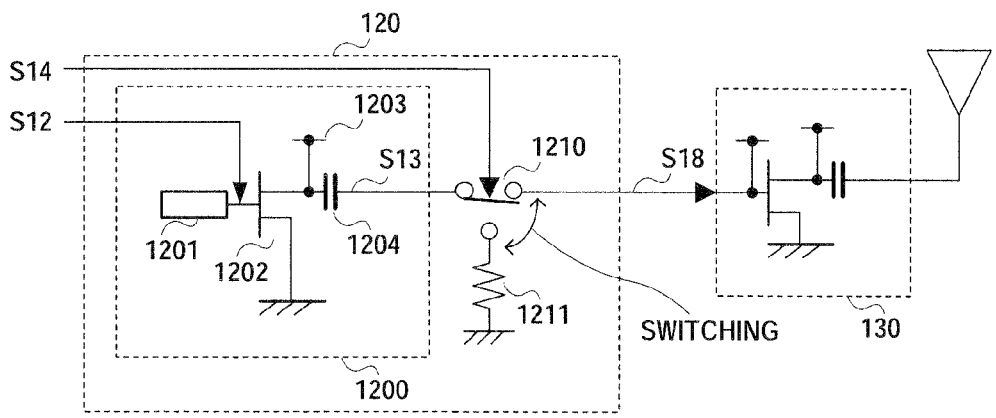
FIG. 7 is a block diagram showing the other main configuration of the intermittent operation circuit according to Embodiment 1.

FIG. 7 shows an example of the main configuration of intermittent operation circuit 120 providing a switch in a subsequent stage to the oscillator to remove the second oscillation signal. In the same drawing, the same reference numerals will be assigned to the same parts as in FIG. 4 and FIG. 6 and repetition of description will be omitted. Intermittent operation circuit 120 shown in FIG. 7 employs a configuration adding switch 1210 and terminating load 1211 compared to FIG. 6, and one terminal of switch 1210 is connected to buffer amplifier 130 and the other terminal is connected to terminating load 1211.

Transmission data deciding section 1101 of control signal generating section 110 outputs control signal S14 to combining section 1104 and outputs control signal S14 to switch 1210 of intermittent operation circuit 120. As described above, combining section 1104 of control signal generating section 110 outputs control signal S12 to the gate terminal of transistor 1202 of intermittent operation circuit 120.

Switch 1210 switches the output destination of the oscillation signal either to terminating load 1211 or buffer amplifier 130, according to control signal S14 outputted from transmission data deciding section 1101 of control signal generating section 110. To be more specific, during ON control signal S14, switch 1210 switches the output destination of the oscillation signal to buffer amplifier 130, and, during OFF control signal S14, switch 1210 switches the output destination of the oscillation signal to terminating load 1211.

By this means, during ON control signal S14, the first oscillation signal (FIG. 5(*i*)) outputted from transistor 1202 is amplified by buffer amplifier 130 and, during OFF control signal S14, switch 1210 is switched to terminating load 1211, so that it is possible to decrease the amplitude level of the second oscillation signal (FIG. 5(*j*)). Further, the signal power ratio of the second oscillation signal outputted when transmission data S11 is "0" to the first oscillation signal outputted when transmission data S11 is "1," is determined by the isolation of switch 1210. Consequently, by providing a switch having an isolation that increases the signal power ratio, it is possible to easily remove an unnecessary second oscillation signal at the receiving end by threshold decision.

Further, by setting the impedance of terminating load 1211 lower than the impedance of buffer amplifier 130 or setting the impedance of terminating load 1211 to such a value that the loop gain of transistor 1202 decreases, the power of a second oscillation signal is decreased and the above signal power ratio is increased so as to remove at the receiving end an unnecessary second oscillation signal at ease by threshold decision.

Figure 8:
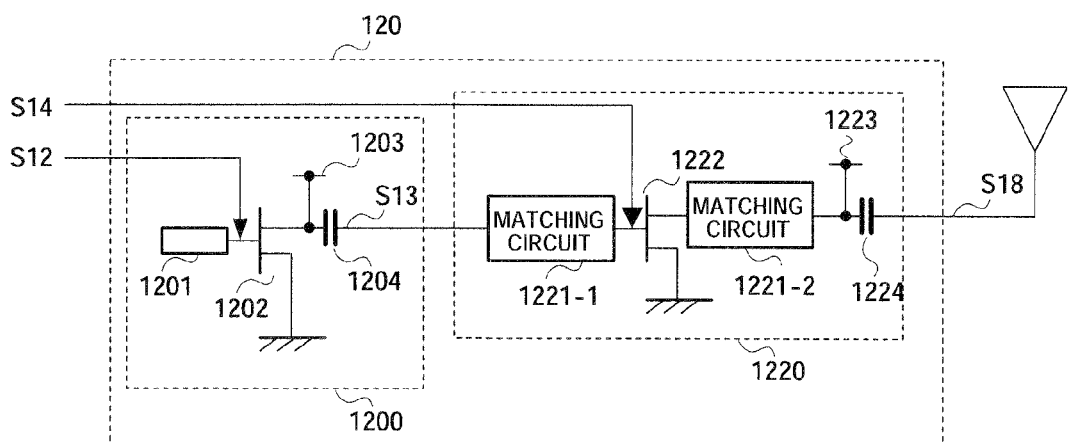
FIG. 8 is a block diagram showing the other main configuration of the intermittent operation circuit according to Embodiment 1.

Further, FIG. 8 shows an example of the main configuration of intermittent operation circuit 120 providing a multiplier in a subsequent stage to the oscillator to remove a second oscillation signal. In the same figure, the same reference numerals will be assigned to the same parts as in FIG. 4 and FIG. 6 and repetition of description will be omitted.

Intermittent operation circuit 120 shown in FIG. 8 employs a configuration adding multiplier 1220 compared to FIG. 6, and multiplier 1220 has matching circuits 1221-1 and 1221-2, transistor 1222, bias terminal 1223 and DC cut capacitor 1224.

Matching circuit 1221-1 is connected to the input terminal end of transistor 1222 and matching circuit 1221-2 is connected to the output terminal end of transistor 1222. Matching circuits 1221-1 and 1221-2 match respective frequencies and transmission signal S18 of 26 GHz is generated in, for example, a case where matching circuit 1221-1 that matches with the input terminal of transistor 1222 at 13 GHz is used and matching circuit 1221-2 that is opened to the output terminal of the transistor at 13 GHz or short-circuited at 13 GHz is used.

The amplitude level of the second oscillation signal can be decreased by switching the operation mode of transistor 1222 of synthesizer 1220 according to control signal S14 and changing the conversion efficiency. For example, a method of outputting control signal S14 to the gate terminal of transistor 1222, changing the gate bias during OFF control signal S14 and reducing the drain current flowing in transistor 1222 and decreasing the amplification factor to decrease the output voltage of the second oscillation signal or a method of increasing the drain current flowing in transistor 1222 during OFF time control signal S14 and making transistor 1222 enter a mode in which distortion is little to decrease the output voltage of the second oscillation signal, may be used.

As described above, according to the present embodiment, intermittent operation circuit 120 that has oscillator 1200 and that intermittently outputs oscillation signal S13 according to control signal S12, and control signal generating section 110 that, according to transmission data S11, controls switching of intermittent operation circuit 120 between the oscillation mode in which the first oscillation signal is outputted and the idling mode in which the second oscillation signal of a lower amplitude than the first oscillation signal is outputted, are provided, so that the parasitic capacity of the intermittent operation circuit in the oscillation mode can be charged uniform in the idling even if the immediately preceding mode is not the oscillation mode. By this means, it is possible to make the pulse waveform of the first oscillation signal irrespective of the immediately preceding transmission data sequence. That is, it is possible to generate the first oscillation signal that has a desired pulse width and that is generated steeply at a desired timing, irrespectively of the transmission data sequence, so that the receiving end is able to reduce deterioration of reception capability due to variation of a spectrum and a timing jitter and acquire optimal received quality. In addition, in the idling mode, the intermittent operation circuit is operated to generate a second oscillation signal of a low amplitude, so that it is possible to generate a pulse modulation signal having a desired pulse waveform while suppressing power consumption as much as possible.

Further, although a case has been described with the present embodiment where the idling mode is provided in which intermittent operation circuit 120 is operated when transmission data S11 is "0" and the second oscillation signal of a lower amplitude than the first oscillation signal is outputted, the present invention is not necessarily limited to this, and intermittent operation circuit 120 may be operated to generate a second oscillation signal of a lower frequency than the first oscillation signal when transmission data S11 is "0". In this case, an unnecessary second oscillation signal can be removed at ease by providing the band limiting filter in a subsequent stage to intermittent operation circuit 120.

Further, although a case has been described with the above description where oscillator 1200 is used as intermittent operation circuit 120, it may be possible to operate only the amplifier intermittently by means of control signal S12 by composing intermittent operation circuit 120 by combining an oscillator and an amplifier. By this means, the oscillator does not operate intermittently but oscillates continuously, so that it is possible to stabilize the oscillation frequency and oscillation output when, for example, the PLL (Phase lock loop) or dielectric resonator is used for the oscillator.

Figure 1:
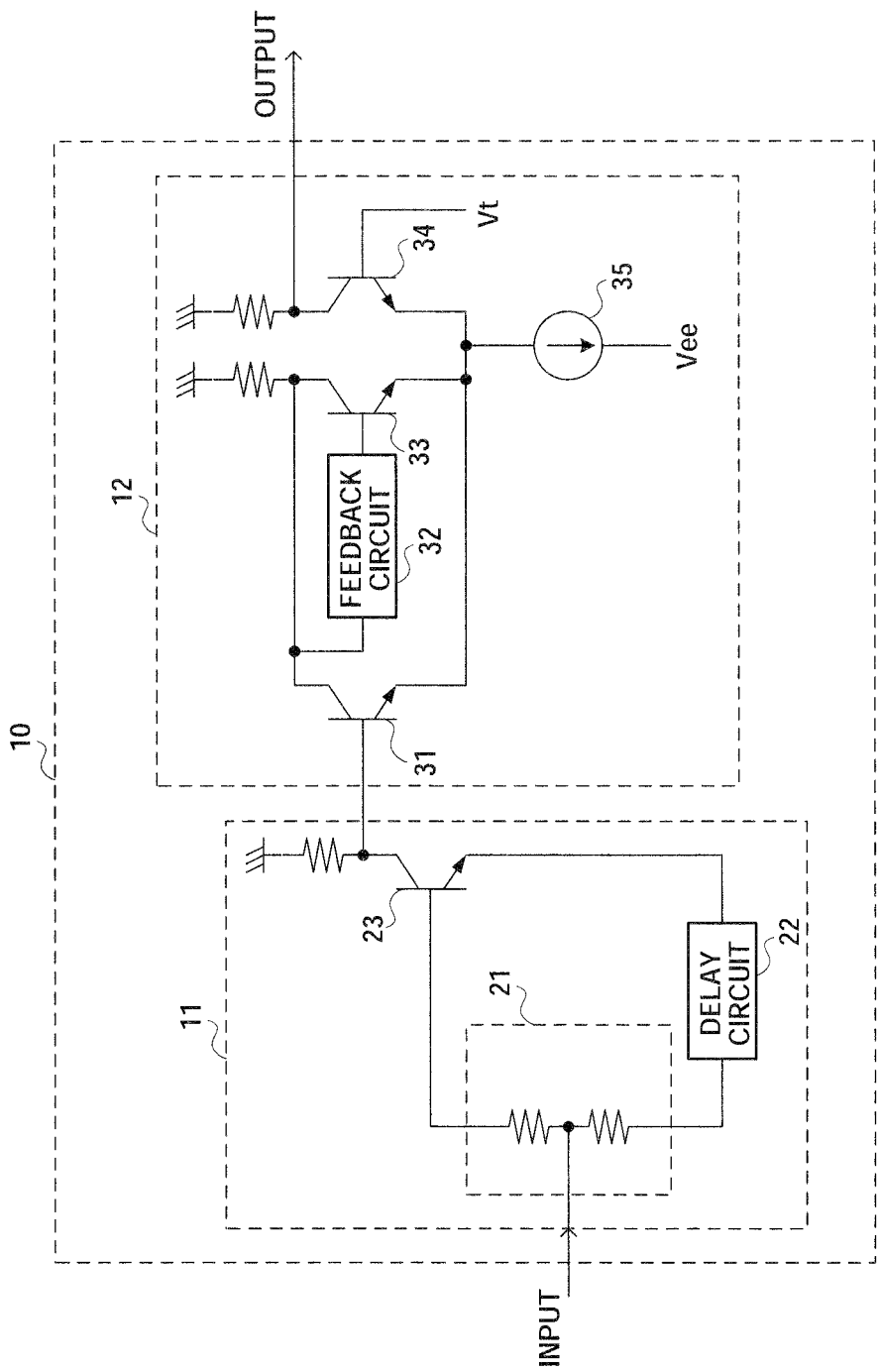
FIG. 1 is a block diagram showing the main configuration of a conventional pulse modulation circuit.
Figure 2:
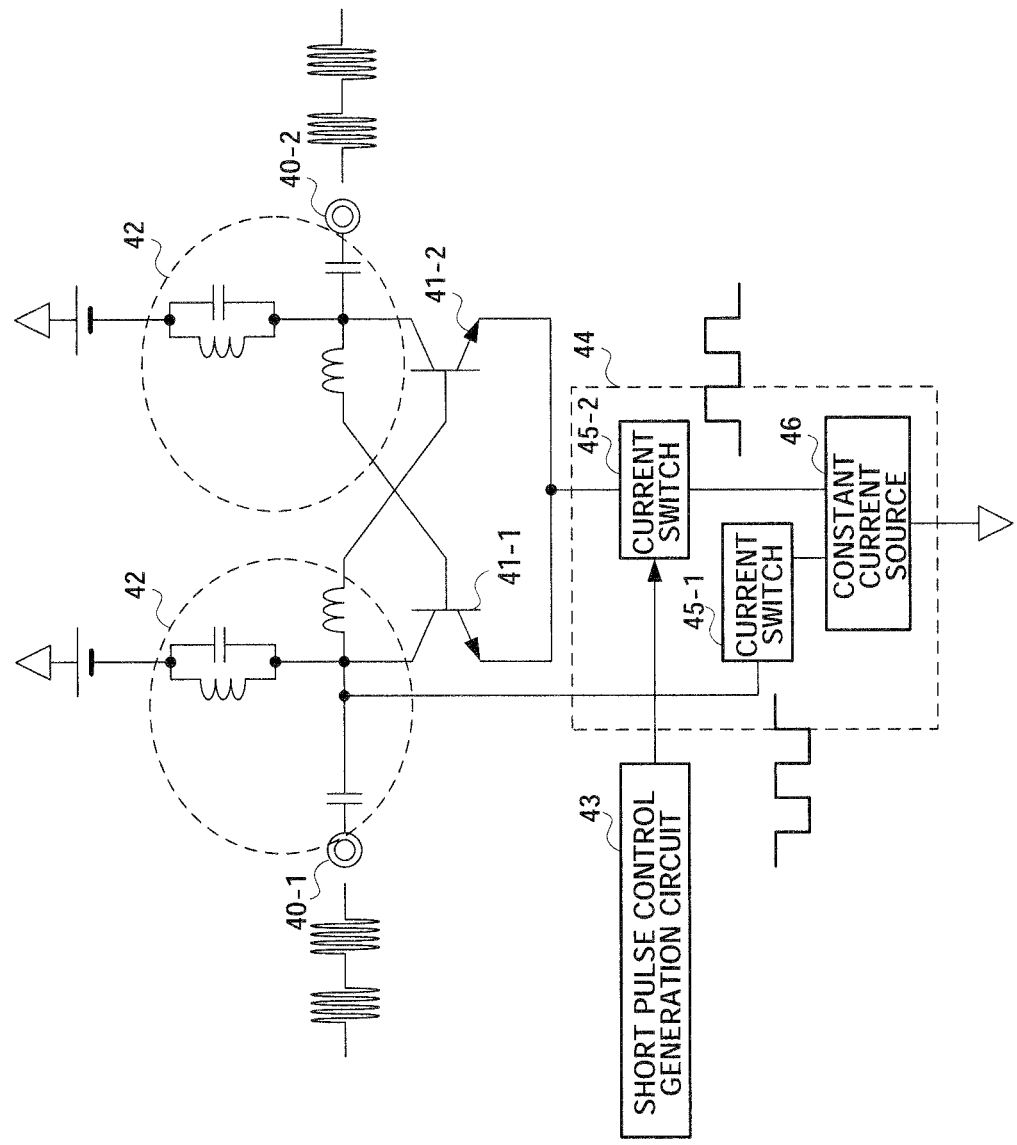
FIG. 2 is a block diagram showing the main configuration of the conventional pulse modulation circuit.

By contrast with this, the pulse modulation circuit disclosed in Non-Patent Document 1 shown in FIG. 2 employs a configuration where, by means of a short pulse signal outputted from short pulse control generation circuit 43 to multivibrator 44, current switches 45-1 and 45-2 make the current flow from constant current source 46 alternately to transistor 41-1 and 41-2, so that transistor 41-1 and 41-2 intermittently operate as differential oscillators and output terminals 40-1 and 40-2 each output signals in opposite phases. Therefore, the oscillation frequency varies significantly due to individual differences between current switches 45-1 and 45-2 and impedance variation due to the temperature.

However, as described above, in a case where only the amplifier is intermittently operated by means of control signal S12, the oscillator does not operate intermittently but oscillates continuously, so that it is possible to stabilize the oscillation frequency.

Further, in a case intermittent operation circuit 120 is composed of the oscillator and the amplifier, both of the oscillator and the amplifier may be intermittently operated according to control signal S12. In this case, compared to a case where only the amplifier is intermittently operated according to control signal S12, it is possible to reduce the overall power consumption of intermittent operation circuit 120 and minimize the power of an unnecessary second oscillation signal by further increasing the signal power ratio by the amplifier. Further, only the oscillator may be intermittently operated by means of control signal S12 and the amplifier may be intermittently operated by control signal S14. In this case, it is possible to further increase the signal power ratio of the first oscillation signal to a second oscillation signal and demodulate the desired first oscillation signal at the receiving end by threshold decision in a reliable manner.

Further, the operation mode of intermittent operation circuit 120 that has a modulating section which generates an ASK (Amplitude Shift Keying) modulation signal or PPM modulation signal may be controlled. As described above, intermittent operation circuit 120 is able to generate a pulse signal that rises steeply, which is particularly useful because, in a case where transmission data is allocated to a position where a pulse signal occurs as in the PPM scheme, the receiving end is able to identify the position at which the pulse occurs.

Figure 9:
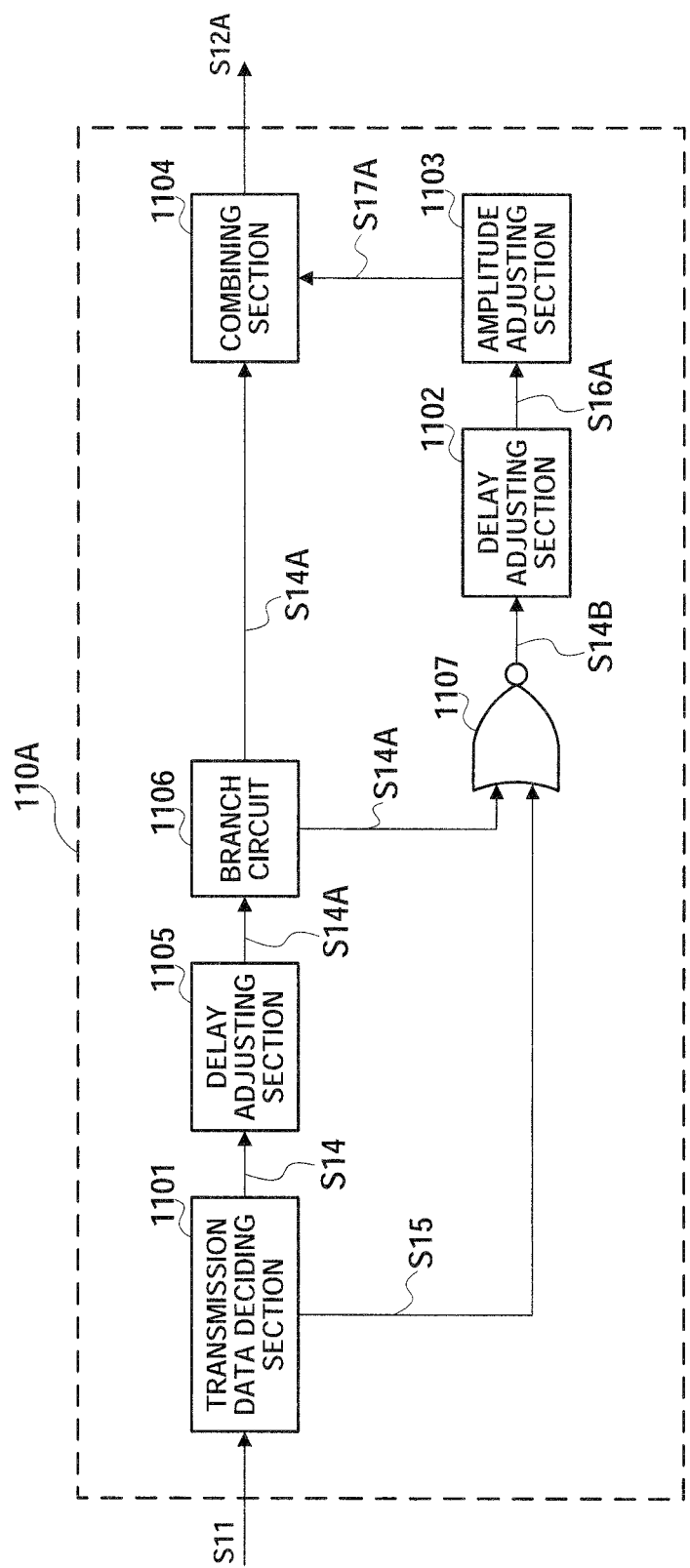
FIG. 9 is a block diagram showing the other main configuration of the control signal generating section according to the above embodiment.

Further, although, with the above description, the intermittent operation circuit is controlled to operate in the idling mode when transmission data is "0," the intermittent operation circuit needs not to enter the idling mode all the while transmission data is "0," the same effect can be obtained by idling the intermittent operation circuit immediately before transmission data "0" becomes "1." The following description will be described using FIG. 9. Control signal generating section 110A shown in FIG. 9 can be replaced with control signal generating section 110 of FIG. 3.

Figure 10:
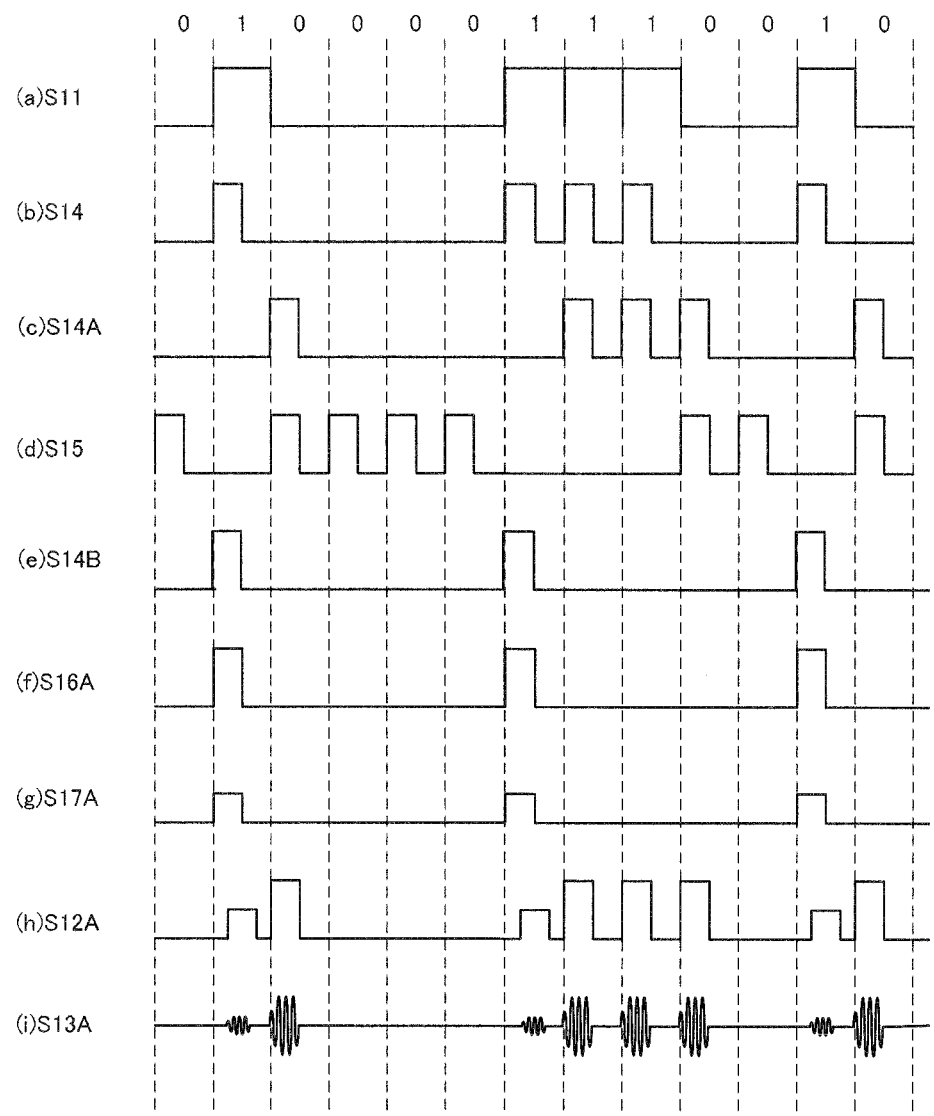
FIG. 10 shows signal waveforms of a control signal and transmission signal according to Embodiment 1.

Control signal generating section 110A is configured to include transmission data deciding section 1101, delay adjusting section 1105, branch circuit 1106, combining section 1104, logical (NOR) circuit 1107, delay adjusting section 1102 and amplitude adjusting section 1103. Each section of control signal generating section 110A will be described below using the timing chart of signal waveforms of FIG. 10.

Transmission data deciding section 1101 decides whether transmission data S11 (FIG. 10(a)) is "1" or "0," generates first control signal S14 (FIG. 10(b)) that rises at a timing matching the start timing of the transmission pulse signal outputted when transmission data S11 is "1" and that has a pulse width equal to the pulse width of the transmission pulse signal, and outputs first control signal S14 to delay adjusting section 1105. On the other hand, transmission data deciding section 1101 generates control signal S15 (FIG. 10(d)) that rises at a timing matching the start timing of the transmission pulse signal outputted when transmission data S11 is "1" and that has a pulse width equal to the pulse width of the transmission pulse signal, and outputs control signal S15 to logical (NOR) circuit 1107.

Further, using the logical circuit of one input and two outputs in transmission data deciding section 1101, control signal S14 and control signal S15 may be generated by inverting one output according to transmission data S11.

Further, if pulse position modulation (PPM) is adopted to change a position of a timing a transmission pulse signal occurs, according to transmission data, transmission data deciding section 1101 only needs to generate control signal S14 and control signal S15 according to whether or not there is a transmission pulse signal in the pulse period.

Delay adjusting section 1105 delays the start timing of control signal S14 outputted from transmission data deciding section 1101 by one pulse and outputs delayed control signal S14A (FIG. 10(c)) to branch circuit 1106.

Branch circuit 1106 branches control signal S14A into two and outputs one to combining section 1104 as the first control signal and the other to logical (NOR) circuit 1107.

Logical (NOR) circuit 1107 outputs control signal S14B (FIG. 10(e)) according to control signal S14A and control signal S15. To be more specific, "1" is outputted only when transmission data of both control signal S14A and control signal S15 are "0."

Delay adjusting section 1102 delays the start timing of control signal S14B outputted from logical (NOR) circuit 1107 by a predetermined period, and outputs delayed control signal S16A (FIG. 10(f)) to amplitude adjusting section 1103.

Further, the delay time of control signal 16A is the same as in the case of control signal S16 and repetition of description will be omitted.

Amplitude adjusting section 1103 decreases the amplitude of control signal S16A outputted from delay adjusting section 1102, and outputs control signal S17A (FIG. 10(g)) with the adjusted amplitude to combining section 1104 as a second control signal. That is, when transmission data S11 is "0" immediately before "1," second control signal S17A having a lower amplitude level than the amplitude level of control signal S14A generated when transmission data S11 is "1." Further, the amplitude level of control signal 17A is the same as in the case of control signal S17 and repetition of description will be omitted.

By combining first control signal S14A and second control signal S17A and outputting combined control signal S12A (FIG. 10(h)) to intermittent operation circuit 120 from combining section 1104, intermittent operation circuit 120 outputs pulse signal S13A (FIG. 10(i)).

With the above configuration, it is possible to idle the intermittent operation circuit only when transmission data is "0" immediately before transmission data becomes "1." By this means, it is possible to make distinct the rise of the first oscillation signal outputted in the oscillation mode, and acquire the start timing of the pulse signal at the receiving end in a reliable manner. Further, only when the immediately following transmission data is "1," the intermittent operation control circuit is controlled in the idling mode, so that it is possible to suppress the operation period of the intermittent operation circuit and reduce the power consumption of the intermittent operation circuit.

(Embodiment 2)

Figure 11:
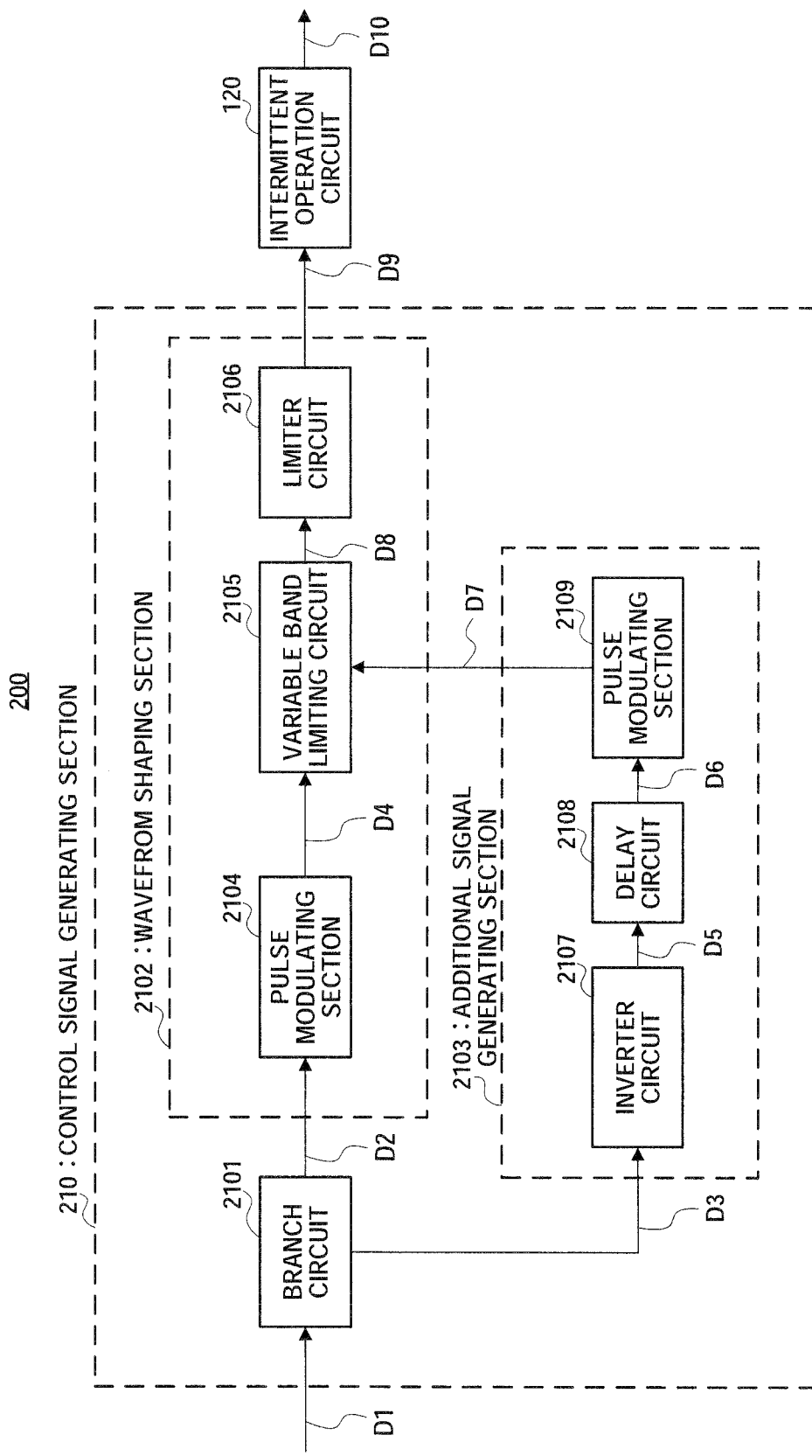
FIG. 11 is a block diagram showing the main configuration of the control signal generating section according to Embodiment 2 of the present invention.

FIG. 11 is a block diagram showing a configuration example of the pulse modulation circuit according to Embodiment 2 of the present invention.

Pulse modulation circuit 200 shown in FIG. 11 is configured to include control signal generating section 210 and intermittent operation circuit 120.

Control signal generating section 210 is configured to include branch circuit 2101, waveform shaping section 2102 and additional signal generating section 2103. Control signal generating section 210 generates control signal D9 according to control signal D1 (i.e. first data signal) outputted from the generation circuit (not shown), and outputs control signal D9 to intermittent operation circuit 120. Further, although a case will be described below where the generation circuit (not shown) generates an alternating current pulse matching transmission data as control signal D1, a signal other than a pulse may be generated.

Branch circuit 2101 branches control signal D1 from the generation circuit (not shown), outputs control signal D2 (D2=D1) to waveform shaping section 2102 and outputs control signal D3 (D3=D1) to additional signal generating section 2103.

Waveform shaping section 2102 shapes the waveform of control signal D2 such that control signal D7 (described later) is added to a predetermined data signal sequence of control signal D2. The predetermined data signal sequence refers to a signal sequence when, for example, "1" follows "0."

To be more specific, waveform shaping section 2102 has pulse modulating section 2104, variable band limiting circuit 2105 and limiter circuit 2106. Pulse modulating section 2104 carries out pulse modulation of control signal D2 from branch circuit 2101. In practice, when the pulse width of control signal D1 (D2), which is transmission data, is T, pulse modulating section 2104 generates control signal D4 employing a pulse width a predetermined period narrower than the pulse width T.

As described below, variable band limiting circuit 2105 limits the band of output signal D4 of pulse modulating section 2104 on a irregular basis based on control signal D7 (described below).

Limiter circuit 2106 limits the amplitude of control signal D8 which is an output of variable band limiting circuit 2105 and outputs this limited control signal D9 to intermittent operation circuit 120. Additional signal generating section 2103 generates control signal D7 (i.e. second data signal) in synchronization with a predetermined data signal sequence set in advance in control signal D1 from control signal generating section 210.

To be more specific, additional signal generating section 2103 has inverter circuit 2107, delay circuit 2108 and pulse modulating section 2109. Inverter circuit 2107 inverts control signal D3 from branch circuit 2101 and outputs control signal D3 to delay circuit 2108.

Delay circuit 2108 delays control signal D5, which is an output of inverter circuit 2107, by a predetermined period, and outputs control signal D5 to pulse modulating section 2109.

Pulse modulating section 2109 carries out pulse modulation of control signal D6, which is an output of delay circuit 2108, and outputs control signal D7 (i.e. second data signal) after pulse modulation to variable band limiting circuit 2105. To be more specific, as in pulse modulating section 2104, when the pulse width of control signal D1 (D2), which is transmission data, is T, pulse modulating section 2109 generates control signal D7 employing a pulse width a predetermined period narrower than the pulse width T.

Intermittent operation circuit 120 charges the input capacity by receiving as input control signal D9 with the waveform shaped in waveform shaping section 2102, and, when the input capacity reaches a predetermined value, outputs a modulated signal by intermittently oscillating control signal D9.

To be more specific, for example, the FET is built in intermittent operation circuit 120, and, when the input capacity of this FET (i.e. the capacity of the input terminal of the FET) reaches a predetermined value, the FET is turned on and off intermittently. By this means, intermittent operation circuit 120 oscillates intermittently, and control signal D9 is modulated and outputted as modulated signal D10.

Figure 12:
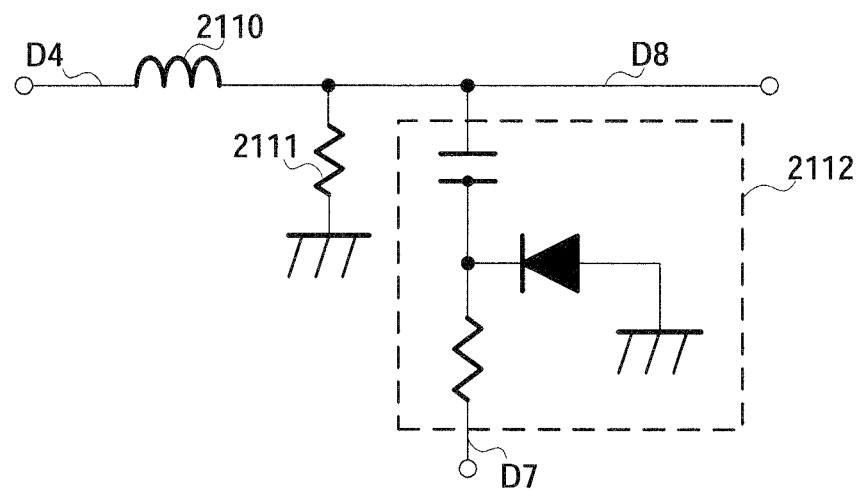
FIG. 12 is a block diagram showing the main configuration of a variable band limiting circuit according to Embodiment 2 of the present invention.

FIG. 12 shows a circuit example of variable band limiting circuit 2105.

In FIG. 12, variable band limiting circuit 2105 is configured by connecting resistance 2111 and varactor diode (variable diode) 2112 in parallel to one end of inductance 2110. Varactor diode 2112 is configured by connecting one end of the resistance and the cathode of the diode in common to one end of the capacitor. The anode of the diode is grounded.

With such a configuration, the capacity of varactor diode 2112 changes according to the reverse voltage applied to the anode of the diode of varactor diode 2112. Consequently, the circuit impedance of variable band limiting circuit 2105 composed of varactor diode 2112, inductance 2110 and resistance 2111 changes. In this way, the cutoff frequency of variable band limiting circuit 2105 changes according to the values of output signals D4 and D7 of pulse modulating sections 2104 and 2109.

Next, the operations of the above sections in pulse modulation circuit 200 will be described with reference to FIG. 13.

Figure 13:
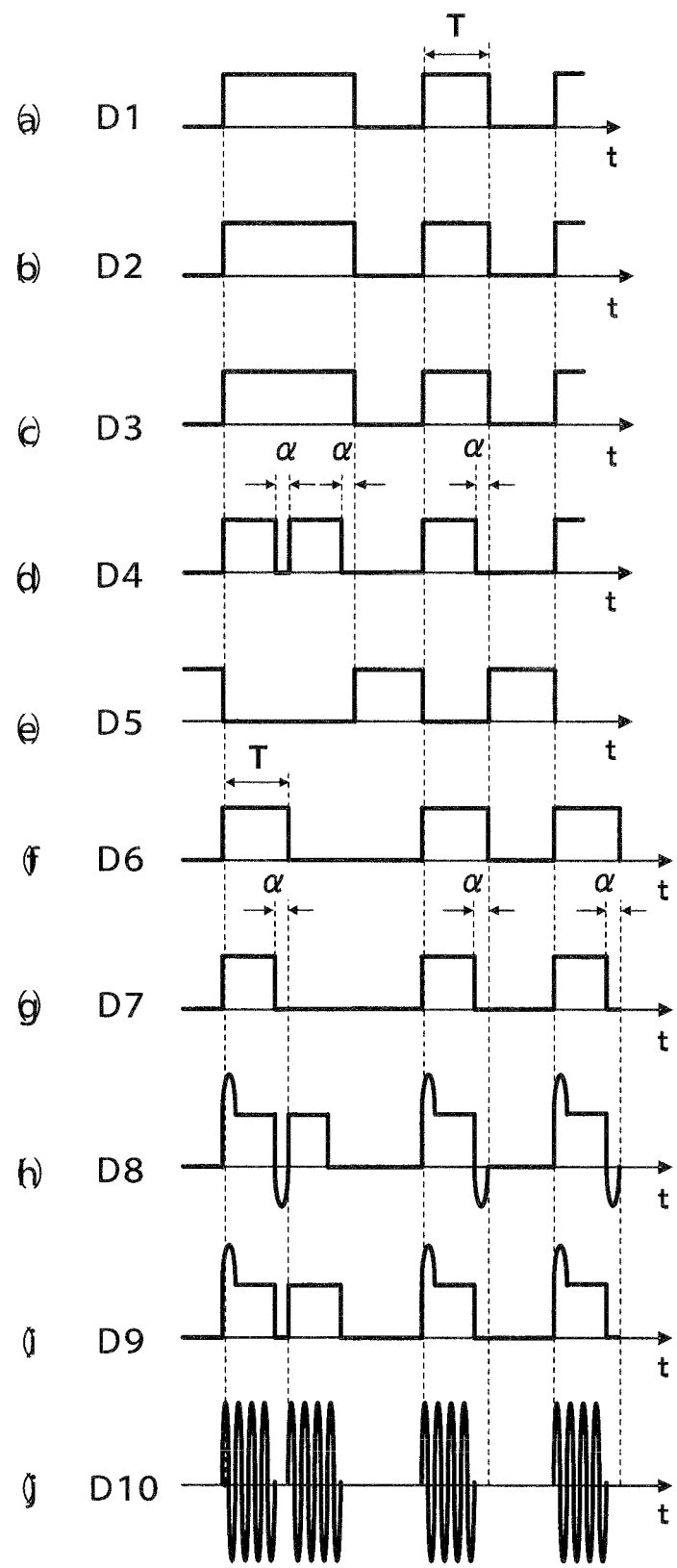
FIG. 13 shows signal waveforms of a control signal and transmission signal according to Embodiment 2.

FIG. 13 shows an example of output waveforms of the sections in pulse modulation circuit 200 will be described.

Although the delay time such as the transmission time and processing time is not taken into account and is described, in practice, synchronization is acquired by a delay circuit (not shown) (the same applies to the other embodiments).

First, control signal D1 which is transmission data is inputted to control signal generating section 210. Control signal D1 of FIG. 13(a) is a pulse signal having, for example, the pulse width T.

Next, branch circuit 2101 branches control signal D1 and outputs two control signals D2 and D3. These output characteristics (i.e. amplitude and frequency) are the same as control signal D1 of FIG. 13(a) (see FIGS. 13(b) and (c)).

Next, pulse modulating section 2104 carries out pulse modulation of control signal D2 from branch circuit 2101 and outputs control signal D4 shown in FIG. 13(d) to variable band limiting circuit 2105. In this case, the pulse width of control signal D4 becomes narrower a predetermined period (for example, α) than the pulse width T.

Further, inverter circuit 2107 inverts control signal D3 from branch circuit 2101 and outputs control signal D5 shown in FIG. 13(e) to delay circuit 2108. Then, delay circuit 2108 delays control signal D5 of FIG. 13(e) by a predetermined time (for example, T) and outputs control signal D6 shown in FIG. 13(f) to pulse modulating section 2109. In this case, control signal D6 rises at the timing control D3 of FIG. 13(c) rises when changing "0" to "1." Then, control signal D6 has the pulse width T.

Next, pulse modulating section 2109 carries out pulse modulation of control signal D6 of FIG. 13(f) and outputs control signal D7 shown in FIG. 13(g) to variable band limiting circuit 2105. In this case, the pulse width of control signal D7 becomes narrower a predetermined period (for example, a) than the pulse width T. That is, the pulse width of control signal D7 is equal to the pulse width of control signal D4 of FIG. 13(d).

Then, variable band limiting circuit 2105 limits the band of control signal D4 of FIG. 13(d) in synchronization with control signal D7 of FIG. 13(g) and outputs control signal D8 shown in FIG. 13(h) to limiter circuit 2106. In this case, control signal D7 of FIG. 13(g) is inputted to varactor diode 2112 (see FIG. 12) of variable band limiting circuit 2105, the circuit impedance of variable band limiting circuit 2105 changes at a timing the signal level of control signal D7 changes ("0"→"1", "1"→"0") and the cutoff frequency decreases.

Then, the ringing produced upon a rise and fall of control signal D7 of FIG. 13(g) are emphasized, control signal D8 of FIG. 13(h) is outputted from variable band limiting circuit 2105. To be more specific, control signal D8 of FIG. 13(h) is formed such that the ringing signal overshoots in the rising portion (a portion in which signals of "1" follows "0") of control signal D7.

Further, in variable band limiting circuit 2105, the circuit impedance is set such that the frequency component of the ringing signal shows a value designated in advance. For example, the frequency component of the ringing signal shows the same or virtually the same (i.e. same degree) as the oscillation frequency of intermittent operation circuit 120.

Next, limiter circuit 2106 receives as input control signal D8 of FIG. 13(h) and limits the negative amplitude of control signal D8. Then, limiter circuit 2106 outputs control signal D9 shown in FIG. 13(i) to intermittent operation circuit 120. In this case, as shown in FIG. 13(i), the amplitude upon a rise of control signal D9 (a portion in which signals of "1" follow "0") is greater than control signal D2 of FIG. 13(b) due to the above ringing signal that overshoots.

That is, when there is a predetermined data signal sequence ("0"→"1") of control signal D1 of FIG. 13(a), the ringing signal overshoots in the rising portion of control signal D1. Then, intermittent operation circuit 120 receives as input control signal D9 of FIG. 13(i) and outputs modulated signal D10 shown in FIG. 13(j) by intermittently oscillating control signal D9. The rises of modulated signal D10 in this case are virtually uniform irrespectively of the order of the data signal sequence, based on the following reason.

That is, in control signal D9 of FIG. 13(i) inputted to intermittent operation circuit 120, when "1" follows "0," a ringing signal overshoots in the rising portion of this "1." Consequently, a charging period for the input capacity (the time it takes to reach a predetermine value) of intermittent operation circuit 120 to which control signal D9 that overshoots is inputted is the same as in cases of other data signal sequences. In this way, it is possible to maintain communication quality irrespectively of data signal sequences.

As described above, according to the present embodiment, pulse modulation circuit 200 generates control signal D7 in synchronization with a predetermined data signal sequence (for example, "0"→"1") set in advance from generated control signal D1. Further, pulse modulation circuit 200 shapes the waveform of control signal D1 such that control signal D7 is added to a predetermined data signal sequence of control signal D1. Then, pulse modulation circuit 200 receives as input control signal D9 with the shaped waveform to charge the input capacity and, when the input capacity reaches a predetermine value, outputs modulated signal D10 by intermittently oscillating control signal D9. Consequently, in case of a predetermined data signal sequence, the waveform of control signal D1 is shaped, so that, accordingly, the input capacity of intermittent operation circuit 120 reaches a predetermined value of the input capacity more easily.

In this way, the charging period for the input capacity becomes constant irrespectively of the data signal sequence and modulated signal D10 rises at virtually regular timings Consequently, it is possible to maintain communication quality irrespectively of data signal sequences.

Further, although, in Embodiment 2, variable band limiting circuit 2105 is configured to include varactor diode 2112, the present invention is not limited to this as long as the cutoff frequency can be made variable. For example, variable band limiting circuit 2105 may be configured by combining a variable resistance and variable inductance.

Further, although a case has been described where the above predetermined data signal sequence is, for example, "0"→"1," "0"→"1" may be applied to other data signal sequences.

(Embodiment 3)

Figure 14:
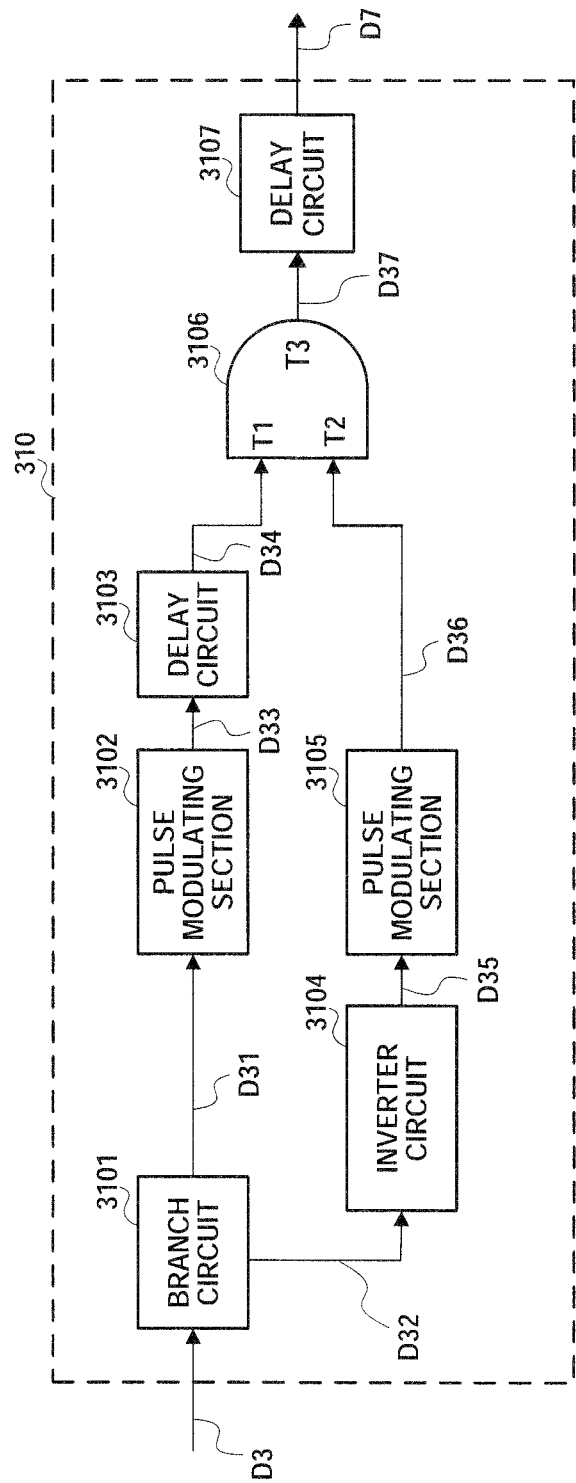
FIG. 14 is a block diagram showing the main configuration of an additional signal generating section according to Embodiment 3 of the present invention.

The modulator in Embodiment 3 differs from Embodiment 2 in having additional signal generating section 310 shown in FIG. 14 instead of additional signal generating section 2103 in Embodiment 2. The other overall configuration of the pulse modulation circuit is the same as in Embodiment 2. The configuration of additional signal generating section 310 will be described in detail below.

FIG. 14 is a block diagram showing a configuration example of additional signal generating section 310 included in the pulse modulation circuit in Embodiment 3. Further, the same reference numerals will be assigned to the same parts as in Embodiment 2 and repetition of description will be appropriately omitted.

In FIG. 14, additional signal generating section 310 has branch circuit 3101 that branches control signal D3 from branch circuit 2101 and outputs control signals D31 and D32, pulse modulating section 3102 that carries out pulse modulation of control signal D31 and delay circuit 3103 that delays control signal D33 which is the output of pulse modulating section 3102.

Further, this additional signal generating section 310 has inverter circuit 3104 that inverts control signal D32 and pulse modulating section 3105 that carries out pulse modulation of control signal D35 which is an output of inverter circuit 3104.

Further, this additional signal generating section 310 has logical AND circuit 3106 that outputs a logical AND operation result of control signal D34, which is an output of delay circuit 3103, and control signal D36, which is an output of pulse modulating section 3105, and delay circuit 3107 that delays and outputs control signal D37, which is an output of logical AND circuit 3106.

Figure 15:
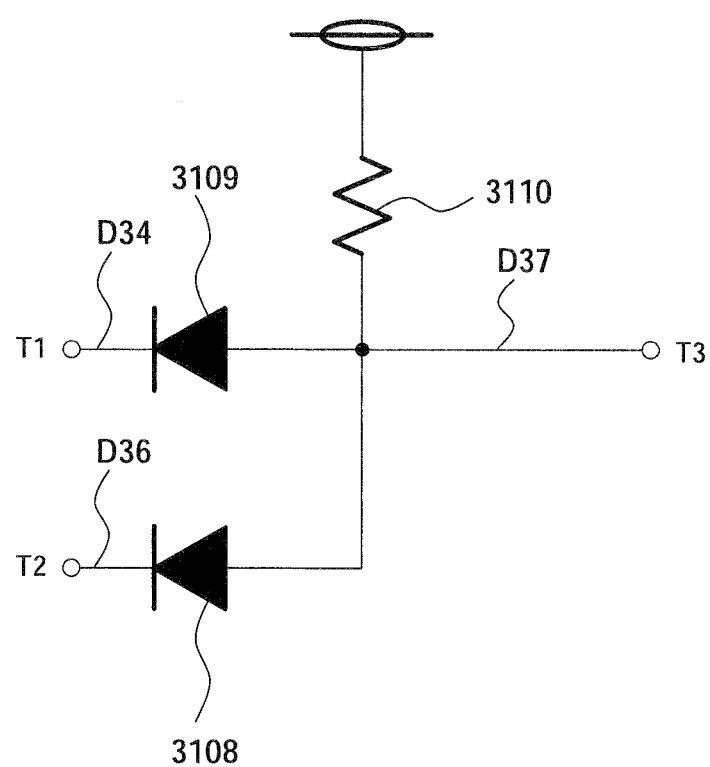
FIG. 15 is a block diagram showing the main configuration of a logical AND circuit according to Embodiment 3.

FIG. 15 shows a circuit example of logical AND circuit 3106.

In FIG. 15, logical AND circuit 3106 is configured to include two diodes 3108 and 3109 and resistance 3110. To be more specific, the cathode of diode 3108 is connected to input terminal T2 of logical AND circuit 3106 and the cathode of diode 3109 is connected to input terminal T1 of logical AND circuit 3106. Further, output terminal T1 of logical AND circuit 3106 is connected in common with the anodes of diodes 3108 and 3109 and one end of resistance 3110. With such a configuration, when all of two input terminals T1 and T2 receive inputs, the positive voltage is outputted from output terminal T3.

Next, the operations of sections in additional signal generating section 310 in Embodiment 3 will be described with reference to FIG. 16.

Figure 16:
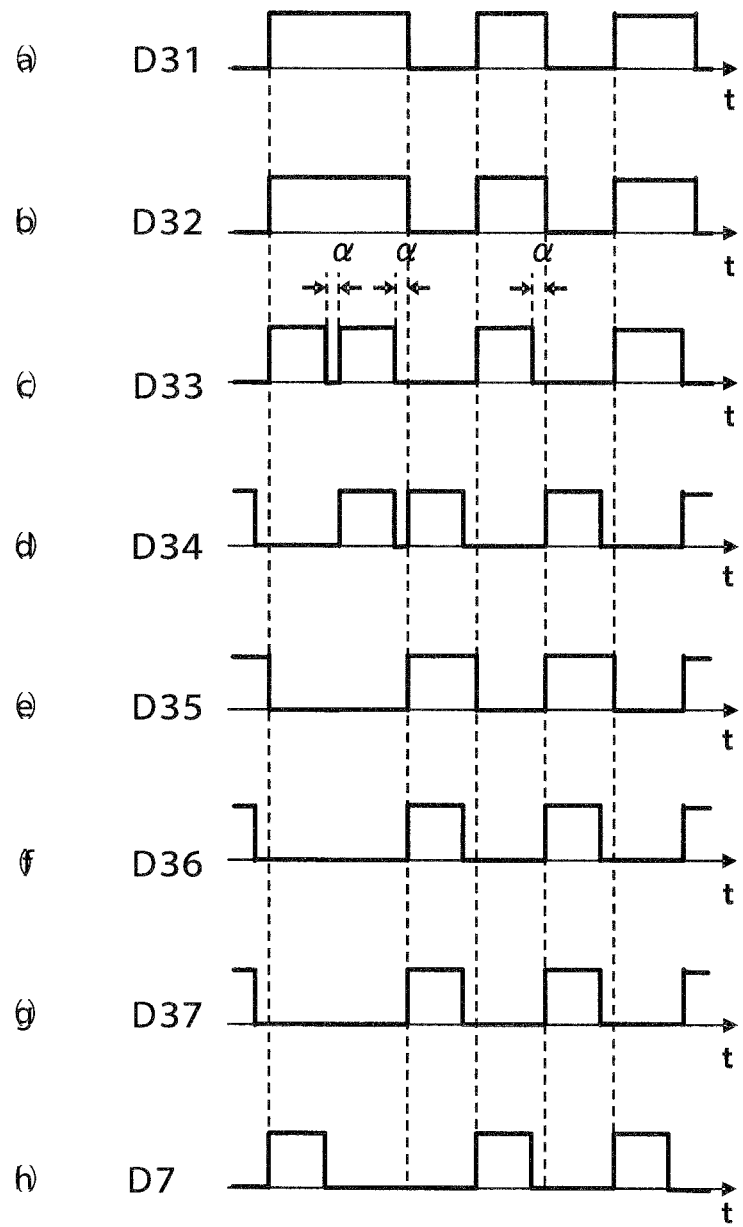
FIG. 16 shows signal waveforms of a control signal and transmission signal according to Embodiment 3.

FIG. 16 shows an example of output waveforms of the sections in additional signal generating section 310.

First, branch circuit 3101 branches control signal D3 (see FIG. 13(c)) and outputs two control signals D31 and D32. The output characteristics of control signals D31 and D32 are the same as control signal D3 of FIG. 13(C) (see FIGS. 16(a) and (b)).

Next, pulse modulating section 3102 carries out pulse modulation of control signal D31 from branch circuit 3101 and outputs control signal D33 shown in FIG. 16(c) to delay circuit 3103. In this case, the pulse width of control signal D33 becomes narrower the predetermined period than the pulse width T.

Then, delay circuit 3103 delays control signal D33 of FIG. 16(c) by a predetermined period (for example, T) and outputs control signal D34 shown in FIG. 16 (d) to logical AND circuit 3106.

Further, inverter circuit 3104 inverts control signal D32 from branch circuit 3101 and outputs control signal D35 shown in FIG. 16(e) to pulse modulating section 3105. Then, pulse modulating section 3105 carries out pulse modulation of control signal D35 of FIG. 16(e) and outputs control signal D36 shown in FIG. 16(f) to logical AND circuit 3106. In this case, control signal D36 rises at the timing control signal D32 of FIG. 16(b) rises when changing from 0 to 1. Further, control signal D36 has the pulse width T.

Next, logical AND circuit 3106 receives as input control signal D34 of FIG. 16(d) and control signal D36 of FIG. 16(f) and outputs control signal D37 shown in FIG. 16(g) to delay circuit 3107. Logical AND circuit 3106 outputs control signal D37 (see FIG. 16(g)) that shows 1 when two pulse signals D34 and D36 are applied as input, to delay circuit 3107.

Then, delay circuit 3107 delays control signal D37 of FIG. 16(g) by a predetermined period (for example, T). By this means, control signal D7 (see FIG. 16(h)) having the same characteristics as control signal D7 shown in FIG. 13(g) is acquired as an output of delay circuit 3107.

Then, delay circuit 3107 outputs control signal D7 of FIG. 16(h) to variable band limiting circuit 2105, so that it is possible to produce the same effect as in Embodiment 2. That is, it is possible to maintain communication quality irrespectively of the data signal sequence of control signal D1.

(Embodiment 4)

Figure 17:
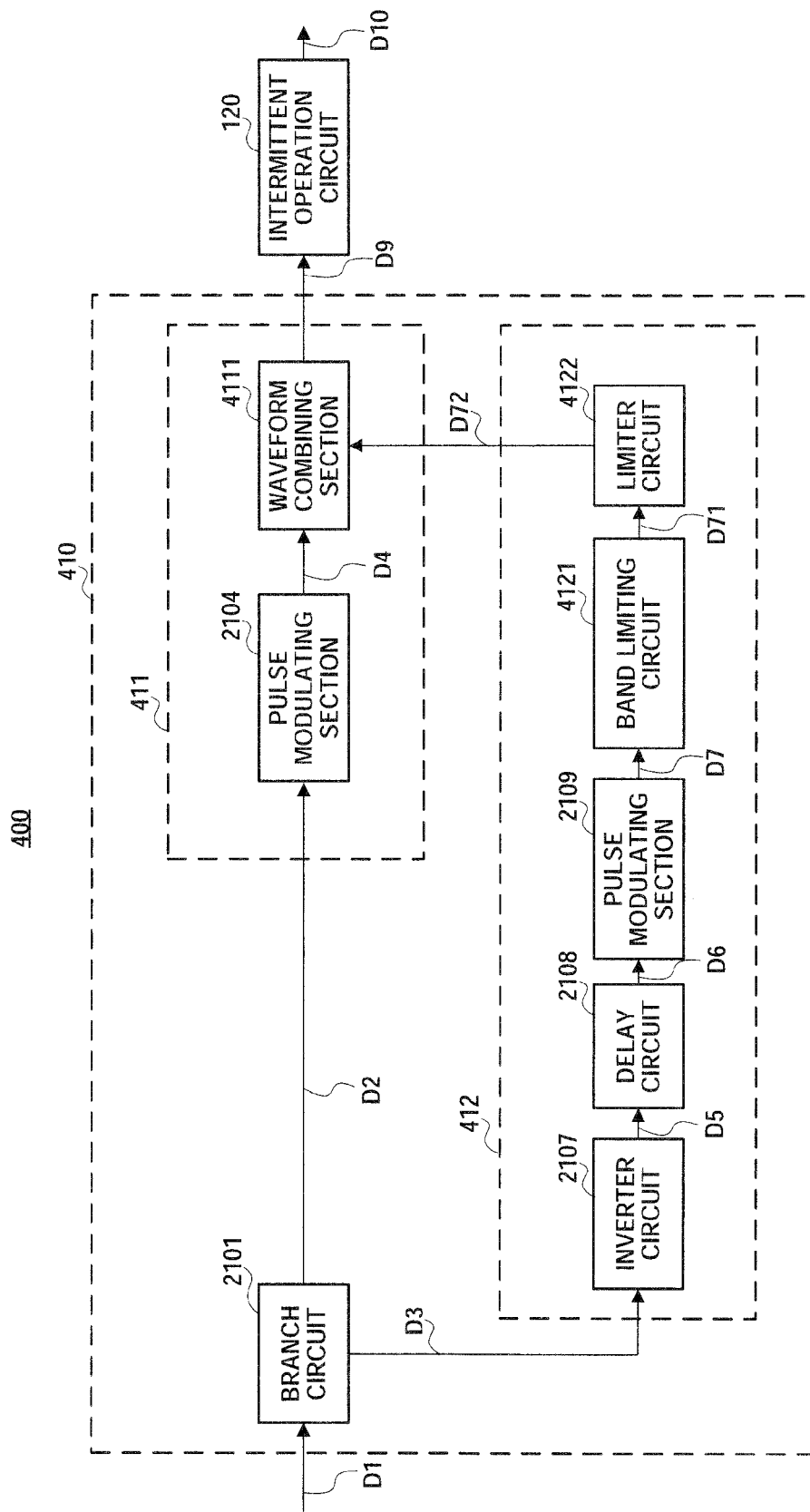
FIG. 17 is a block diagram showing the main configuration of a pulse modulation circuit according to Embodiment 4 of the present invention.

Control signal generating section 410 in Embodiment 4 differs from Embodiment 2 in having waveform shaping section 411 and additional signal generating section 412 shown in FIG. 17 instead of waveform shaping section 2102 and additional signal generating section 2103 in Embodiment 2. The other overall configuration of the pulse modulation circuit is the same as in Embodiment 2. Therefore, the configurations of waveform shaping section 411 and additional signal generating section 412 will be focused upon and described.

FIG. 17 is a block diagram showing a configuration example of pulse modulation circuit 400 in Embodiment 4. Further, the same reference numerals will be assigned to the same parts as in Embodiments 2 and 3 and repetition of description will be omitted.

In FIG. 17, pulse modulation circuit 400 has above waveform shaping section 411 and additional signal generating section 412 in addition to branch circuit 2101 and intermittent operation circuit 120 in Embodiment 2.

Waveform shaping section 411 has pulse modulating section 2104 and waveform combining circuit 4111. Pulse modulating section 2104 carries out pulse modulation of control signal D2 from branch circuit 2101 and outputs control signal D2 to waveform combining circuit 4111. Waveform shaping circuit 4111 combines control signal D72, which is an output of limiter circuit 4122 (described later), to control signal D4, which is an output of pulse modulating section 2104.

Additional signal generating section 412 further includes band limiting circuit 4121 and limiter circuit 4122 in addition to inverter circuit 2107, delay circuit 2108 and pulse modulating section 2109 in Embodiment 2. Band limiting circuit 4121 limits the band of control signal D7 which is an output of pulse modulating section 2109, and outputs control signal D7 to limiter circuit 4122. Limiter circuit 4122 limits the amplitude of control signal D71, which is an output of band limiting circuit 4121.

Next, the operation of sections in pulse modulation circuit 400 in Embodiment 4 will be described with reference to FIG. 18.

Figure 18:
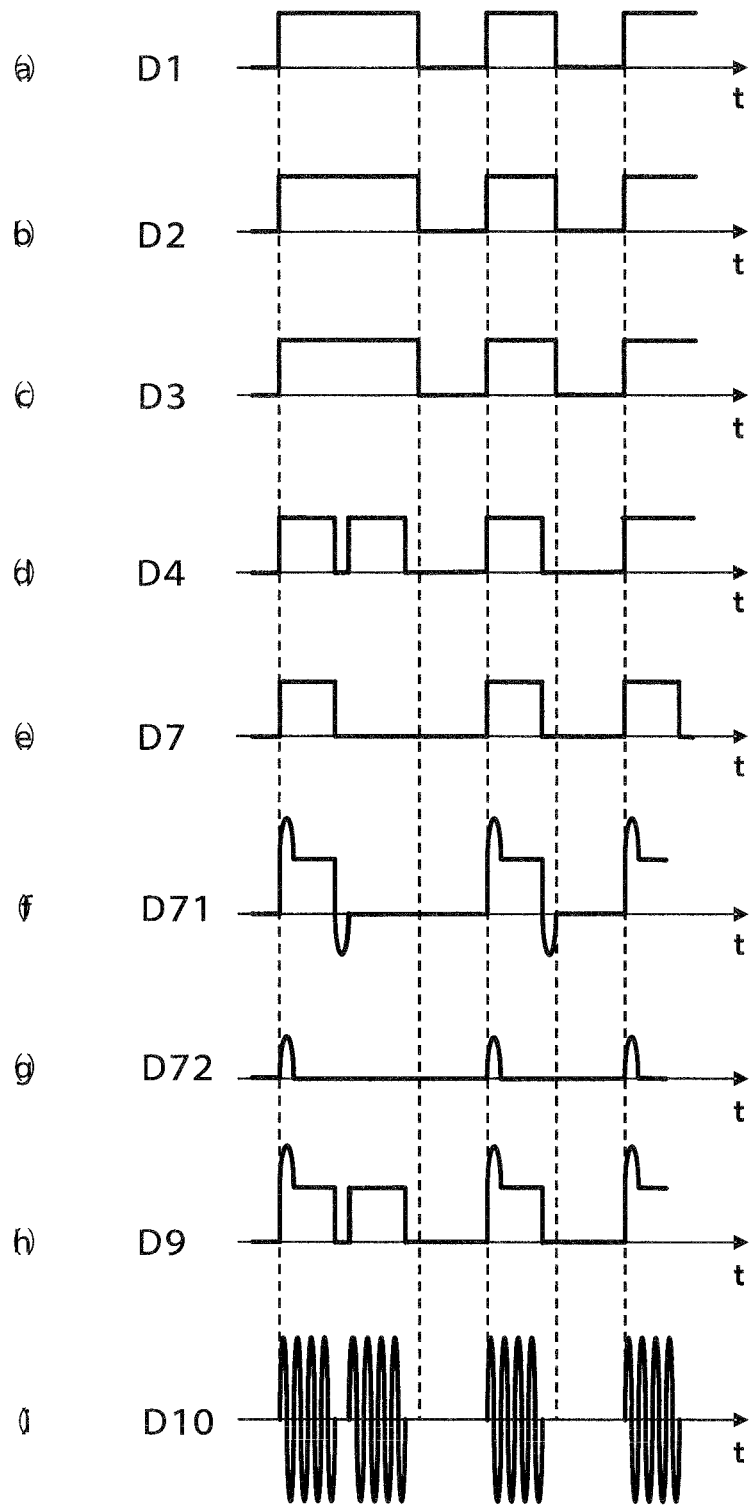
FIG. 18 shows signal waveforms of a control signal and transmission signal according to Embodiment 4.

FIG. 18 shows an example of output waveforms in the sections in pulse modulation circuit 400. Further, given that FIG. 18(a) to FIG. 18(e) and FIG. 18(h) are the same as FIG. 13(a) to FIG. 13(g) and FIG. 13(i), output waveforms of FIG. 18(f), (g) and (i) will be focused upon and described below.

Control signal D71 shown in FIG. 18(f) represents an output waveform of band limiting circuit 4121 and the band of control signal D7 (see FIG. 18(e)), which is the output of pulse modulating section 2109, is limited.

To be more specific, as to control signal D71, the ringing produced upon a rise and fall of the pulse are emphasized. In this case, the impedance value of band limiting circuit 4121 is set in advance such that the frequency component of the ringing signal shows the same or virtually the same (the same degree) as, for example, the oscillation frequency of intermittent operation circuit 120.

Control signal D72 shown in FIG. 18(g) represents an output waveform of limiter circuit 4122, and band limitation is carried out such that only the frequency component of the positive ringing signal remains out of the frequency component of control signal D71 of FIG. 18(f).

By so doing, in waveform combining circuit 4111, control signal D72 of FIG. 18(*g*) is superimposed (combined) on control signal D4 of FIG. 18(*d*) and control signal D9 (see FIG. 18(*h*)) having the same characteristics as control signal D9 shown in FIG. 13(*i*) is outputted from waveform combining circuit 4111 to intermittent operation circuit 120.

Then, as in the case of Embodiment 2, control signal D9 of FIG. 18(*h*) is intermittently oscillated in intermittent operation circuit 120 and modulated signal D10 of FIG. 18(*i*) is outputted.

As described above, it is possible to produce the same effect as in Embodiment 2. That is, it is possible to maintain communication quality irrespectively of the data signal sequence of control signal D1.

Further, the present invention is not limited to Embodiments 1 to 4 and may be changed as long as the gist of the present invention does not deviate. For example, although cases have been described with Embodiments 2 to 4 where branch circuit 2101 branches control signal D1, two control signals D1 may be both inputted to the waveform shaping section and to the additional signal generating section, by removing branch circuit 2101.

Further, although cases have been described with the above embodiments as examples where intermittent operation circuit 120 is an oscillator that outputs an oscillation signal, the present invention is not limited to this. For example, a multiplier, amplifier or complex circuit of the multiplier and amplifier may be used as the intermittent operation circuit. When the multiplier or amplifier is operated intermittently, it is possible to operate an intermittent operation circuit intermittently by inputting control signal S12 (or control signal D9) to one of the gate (emitter) terminal, the drain (collector) terminal or the source (base) terminal of an FET (Field effect transistor) composing the multiplier and amplifier.

Further, although, with the above embodiments, a method of suppressing the change of the pulse waveform that depends on the transmission data sequence per pulse to maintain a desired pulse waveform has been described, the present invention is not limited only in application to transmission data per pulse. Given that an active circuit configuration is generally employed in the control signal generating section, a DC cut capacitor is inserted between the control signal generating section and intermittent operation circuit. It is generally known that, when burst transmission for intermittently transmitting a plurality of pulses under such conditions is carried out, a DC offset is produced when control signal S12 (or control signal D9) transitions from a burst signal "off" interval to a burst signal "on" interval, and hundreds to about thousand symbols from the head of the burst signal "on" interval are influenced. Consequently, it is possible to produce the same effect by shaping the waveform of the burst signal sequence instead of the data sequence using the method described in the above embodiments.

One aspect of the pulse modulation circuit according to the present invention employs a configuration including: an intermittent operation circuit that intermittently outputs a transmission signal according to a control signal; and a control circuit that, according to transmission data, controls switching of the intermittent operation circuit between a transmission mode in which a first transmission signal is outputted and an idling mode in which a second transmission signal of a lower amplitude or lower frequency than the first transmission signal is outputted.

According to this configuration, an idling mode is provided in addition to the transmission mode, so that the circuit capacity of the intermittent circuit in the transmission mode can be charged virtually uniform in the idling mode even if the immediately preceding mode is not the transmission mode. By this means, it is possible to make the pulse waveform of the first transmission signal irrespective of the immediately preceding transmission data sequence. That is, it is possible to generate the first transmission signal that has a desired pulse width and that is generated steeply at a desired timing, irrespectively of the transmission data sequence, so that the receiving end is able to reduce deterioration of reception capability due to variation of a spectrum and a timing jitter and acquire optimal received quality. In addition, in the idling mode, the intermittent operation circuit is operated to generate a second transmission signal of a low amplitude or low frequency, so that it is possible to generate a pulse modulation signal having a desired pulse waveform while suppressing power consumption.

One aspect of the pulse modulation circuit according to the present invention employs a configuration in which the intermittent operation circuit includes at least one of an oscillator, multiplier and amplifier.

According to this configuration, it is possible to operate an intermittent operation circuit intermittently and generate a transmission signal by inputting a control signal to one of the gate (emitter) terminal, the drain (collector) terminal or the source (base) terminal of an FET composing an oscillator, multiplier and amplifier.

One aspect of the pulse modulation circuit according to the present invention employs a configuration in which the control circuit controls the intermittent operation circuit to operate in a transmission mode when the transmission data is 1, controls the intermittent operation circuit to operate in the idling mode when the transmission data is 0 and controls the intermittent operation circuit such that a period of the idling mode is shorter than a period of the transmission mode.

According to this configuration, the period of the idling mode in which transmission data is "0" and the desired first transmission signal is not generated is shortened and the operation period of the intermittent operation circuit is shortened, so that it is possible to reduce the power consumption of the intermittent operation circuit.

One aspect of the pulse modulation circuit according to the present invention employs a configuration in which the control circuit further controls the intermittent operation circuit to switch to a stop mode in which the transmission signal is not outputted, between the transmission mode and the idling mode.

According to this configuration, the intermittent operation circuit enters the stop state immediately before the start timing of the desired first transmission signal and does not output a transmission signal, so that it is possible to generate a pulse signal that rises steeply at a timing matching the start timing of the desired first transmission signal, make distinct the rise of the pulse signal and, at the receiving end, acquire the start timing of the pulse signal in a reliable manner.

One aspect of the pulse modulation circuit according to the present invention employs a configuration in which the control circuit variably controls a switching timing to the idling mode according to a parasitic capacity of the intermittent operation circuit.

According to this configuration, it is possible to minimize the operation period of the intermittent operation circuit in the idling mode to charge the circuit capacity of the intermittent operation circuit by the amount that is required and sufficient, and stably generate pulse signals that rise steeply while reducing power consumption of the intermittent operation circuit.

One aspect of the pulse modulation circuit according to the present invention employs a configuration in which an amplitude of the second transmission signal in the idling mode is variably controlled according to the parasitic capacity of the intermittent operation circuit.

According to this configuration, it is possible to decrease the amplitude of a second transmission signal outputted in the idling mode to charge the parasitic capacity of the intermittent operation circuit by the amount that is required and sufficient, and stably generate pulse signals that rise steeply while reducing power consumption of the intermittent operation circuit.

One aspect of the pulse modulation circuit according to the present invention employs a configuration including a signal cutoff section that cuts off the second signal outputted in the idling mode while passing the first transmission signal outputted in the transmission mode.

According to this configuration, an unnecessary second transmission signal is cut off and the desired first transmission signal alone is allowed to pass, so that the receiving end is able to prevent deterioration of received quality as a result of receiving an unnecessary second transmission signal.

One aspect of the pulse modulation circuit according to the present invention employs a configuration in which the first transmission signal is allowed to pass and the second transmission signal is cut off by using a multiplier as the signal cutoff section and controlling a conversion efficiency of the multiplier.

According to this configuration, it is possible to decrease the amplitude level of the second transmission signal in desired frequency components by decreasing the conversion efficiency for an unnecessary second transmission signal and reduce deterioration of received quality.

One aspect of the pulse modulation circuit according to the present invention employs a configuration including a modulator that changes at least one of an amplitude and a phase of the first transmission signal formed by the intermittent operation circuit according to the transmission data.

According to this configuration, it is possible to generate an ASK modulation signal or phase modulation signal that has a desired pulse width and that is generated at a desired timing, so that the receiving end is able to reduce deterioration of reception capability due to variation of a spectrum and a timing jitter, and acquire optimal received quality without requiring the circuit for generating an alternating current signal in perfect synchronization with a modulated signal.

One aspect of the pulse modulation circuit according to the present invention employs a configuration in which the control circuit controls the intermittent operation circuit to operate in the idling mode only when the immediately following transmission data becomes 1.

According to this configuration, only in a case where immediately following transmission data is "1," the intermittent operation circuit is controlled to operate in the idling mode, so that it is possible to decrease the operation period of the intermittent operation circuit and further reduce the power consumption of the intermittent operation circuit.

One aspect of the pulse modulation circuit according to the present invention employs a configuration including: an additional signal generating section that generates a second data signal sequence for shaping a waveform of a predetermined arrangement portion of a first data signal sequence; a waveform shaping section that generates a signal including an overshooting portion by shaping the waveform of the first data signal sequence using the second data signal sequence; and an intermittent operating section that charges a circuit capacity based on a signal with the waveform shaped by the waveform shaping section and outputs a transmission signal when the circuit capacity reaches a predetermined value.

According to this configuration, the circuit capacity of the intermittent operation circuit more easily reaches a predetermined value of the capacity in the transmission mode, so that it is possible to make the waveform of the transmission signal irrespective of the immediately preceding data sequence. That is, it is possible to generate the transmission signal that has a desired pulse width and that is generated steeply at a desired timing, irrespectively of the first data signal sequence, so that the receiving end is able to reduce deterioration of reception capability due to variation of a spectrum and a timing jitter and acquire optimal received quality.

One aspect of the pulse modulation circuit according to the present invention employs a configuration in which the intermittent operation circuit includes at least one of an oscillator, multiplier and amplifier.

According to this configuration, it is possible to operate the intermittent operation circuit intermittently and generate a transmission signal by inputting a control signal to one of the gate (emitter) terminal, the drain (collector) terminal or the source (base) terminal of an FET composing the oscillator, multiplier and amplifier.

One aspect of the pulse modulation circuit according to the present invention employs a configuration in which: when the first data signal sequence is a pulse signal, the predetermined arrangement is a data signal sequence that becomes 1 immediately after 0; the additional signal generating section generates, as the second data signal sequence, a pulse signal that rises at a timing the first data signal sequence becomes 1 immediately after 0; and the waveform shaping section adds a ringing signal to a rising portion in which the first data signal sequence becomes 1 immediately after 0 based on the second data signal sequence.

According to this configuration, when the first data signal sequence is "1" and the intermittent operation circuit is operated in the transmission mode, even if the immediately preceding data is "0," the rising portion in which the first data signal sequence is "1" overshoots, so that the input capacity of the intermittent operation circuit is charged faster. By this means, the charging period for the input capacity of the intermittent operation circuit when the immediately preceding data is "0", is the same as in the case where the immediately preceding data is not "0," so that it is possible to generate a transmission signal that has a desired pulse width and that is generated steeply at a desired timing, irrespectively of the transmission data sequence.

One aspect of the pulse modulation circuit according to the present invention employs a configuration including a variable band limiting section that makes variable a cutoff frequency for limiting a band of the first data signal sequence according to the second data signal sequence.

According to this configuration, by decreasing the cutoff frequency at a timing the second data signal sequence is "1" immediately after "0," the rising portion in which the first data signal sequence is "1" immediately after "0," overshoots, so that the input capacity of the intermittent operation circuit is charged faster.

According to this configuration, by decreasing the cutoff frequency at a timing the first data signal sequence is "1" immediately after "0," it is possible to make the rising portion overshoot in which the first data signal sequence is "1" immediately after "0."

One aspect of the pulse modulation circuit according to the present invention employs a configuration in which: the additional signal generating section generates the ringing signal based on the second data signal sequence; and the waveform shaping section combines the ringing signal to the first data signal sequence.

According to this configuration, when the first data signal sequence is "1" and the intermittent operation circuit is operated in the transmission mode, even if immediately preceding data is "0," it is possible to make the rising portion overshoot in which the first data signal sequence is "1."

One aspect of the pulse modulation circuit according to the present invention employs a configuration in which the ringing signal has the same or virtually the same frequency as the intermittent operation section.

According to these configurations, it is possible to efficiently charge the input capacity of the intermittent operation circuit.

The disclosures of Japanese Patent Application No. 2006-170450, filed on Jun. 20, 2006, Japanese Patent Application No. 2006-193097, filed on Jul. 13, 2006, Japanese Patent Application No. 2007-157937, filed on Jun. 14, 2007, including the specifications, drawings and abstracts, are incorporated herein by reference in their entirety.

INDUSTRIAL APPLICABILITY

The present invention is able to form a pulse modulation signal that has a desired pulse waveform, irrespectively of the transmission data signal sequence and is useful for, for example, a pulse modulation circuit and pulse modulation method for generating an alternating current signal intermittently according to transmission data.

The invention claimed is:

1. A pulse modulation circuit comprising:
an intermittent operation circuit that intermittently outputs a transmission signal according to a control signal; and
a control circuit that, according to transmission data controls switching of the intermittent operation circuit between a transmission mode in which a first transmission signal is outputted and a pre-charge mode in which a second transmission signal of a lower amplitude or lower frequency than the first transmission signal is outputted,
wherein the control circuit comprises a function for variably controlling a switching timing to the pre-charge mode according to a parasitic capacity of the intermittent operation circuit, and
the control circuit controls the intermittent operation circuit to operate in a transmission mode when the transmission data is 1, controls the intermittent operation circuit to operate in the pre-charge mode when the transmission data is 0 and controls the intermittent operation circuit such that a period of the pre-charge mode is shorter than a period of the transmission mode.

2. The pulse modulation circuit according to claim 1, wherein the intermittent operation circuit comprises at least one of an oscillator, multiplier and amplifier.

3. A pulse modulation circuit comprising:
an intermittent operation circuit that intermittently outputs a transmission signal according to a control signal; and
a control circuit that, according to transmission data, controls switching of the intermittent operation circuit between a transmission mode in which a first transmission signal is outputted and a pre-charge mode in which a second transmission signal of a lower amplitude or lower frequency than the first transmission signal is outputted,
wherein the control circuit comprises a function for variably controlling a switching timing to the pre-charge mode according to a parasitic capacity of the intermittent operation circuit, and
the control circuit further controls the intermittent operation circuit to switch to a stop mode in which the transmission signal is not outputted, between the transmission mode and the pre-charge mode.

4. A pulse modulation circuit comprising:
an intermittent operation circuit that intermittently outputs a transmission signal according to a control signal; and
a control circuit that, according to transmission data, controls switching of the intermittent operation circuit between a transmission mode in which a first transmission signal is outputted and a pre-charge mode in which a second transmission signal of a lower amplitude or lower frequency than the first transmission signal is outputted,
wherein the control circuit comprises a function for variably controlling a switching timing to the pre-charge mode according to a parasitic capacity of the intermittent operation circuit, and
when the parasitic capacity of the intermittent operation circuit is greater, the control circuit makes the switching timing to the pre-charge mode come earlier and makes longer a period of the pre-charge mode of the intermittent operation circuit.

5. A pulse modulation circuit comprising:
an intermittent operation circuit that intermittently outputs a transmission signal according to a control signal; and
a control circuit that, according to transmission data, controls switching of the intermittent operation circuit between a transmission mode in which a first transmission signal is outputted and a pre-charge mode in which a second transmission signal of a lower amplitude or lower frequency than the first transmission signal is outputted,
wherein the control circuit comprises a function for variably controlling a switching timing to the pre-charge mode according to a parasitic capacity of the intermittent operation circuit, and
the control circuit variably controls an amplitude of the second transmission signal in the pre-charge mode according to the parasitic capacity of the intermittent operation circuit.

6. The pulse modulation circuit according to claim 5, wherein, when the parasitic capacity of the intermittent operation circuit is greater, the control circuit increases the amplitude of the second transmission signal in the pre-charge mode.

7. The pulse modulation circuit according to claim 1, further comprising a signal cutoff section that cuts off the second signal outputted in the pre-charge mode while passing the first transmission signal outputted in the transmission mode.

8. The pulse modulation circuit according to claim 7, wherein the first transmission signal is allowed to pass and the second transmission signal is cut off by using a multiplier as the signal cutoff section and controlling a conversion efficiency of the multiplier.

9. The pulse modulation circuit according to claim 1, further comprising a modulator that changes at least one of an amplitude and a phase of the first transmission signal formed by the intermittent operation circuit according to the transmission data.

10. The pulse modulation circuit according to claim 1, wherein the control circuit controls the intermittent operation circuit to operate in the pre-charge mode only when the immediately following transmission data becomes 1.

11. The pulse modulation circuit according to claim 1, wherein an on-off keying modulation is carried out to output an alternating current pulse when the transmission data is 1 and not to output the alternating current pulse when the transmission data is 0.

* * * * *